(12) United States Patent
Kimura et al.

(10) Patent No.: US 6,529,304 B1
(45) Date of Patent: Mar. 4, 2003

(54) OPTICAL COMMUNICATION EQUIPMENT AND SYSTEM

(75) Inventors: Yoshinobu Kimura, Kita-ku (JP); Masanobu Miyao, Fukuoka (JP); Kiyokazu Nakagawa, Sayama (JP); Nobuyuki Sugii, Nakano-ku (JP); Takuya Maruizumi, Koganei (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/381,199

(22) PCT Filed: Sep. 19, 1997

(86) PCT No.: PCT/JP97/03337
§ 371 (c)(1),
(2), (4) Date: Sep. 17, 1999

(87) PCT Pub. No.: WO99/16193
PCT Pub. Date: Apr. 1, 1999

(51) Int. Cl.⁷ .................................................. H04B 10/00
(52) U.S. Cl. ..................... 359/160; 359/124; 359/341.1
(58) Field of Search ................................. 359/160, 124, 359/134, 337, 341.1, 341.31

(56) References Cited

U.S. PATENT DOCUMENTS

| | | | |
|---|---|---|---|
| 4,826,295 A | | 5/1989 | Burt |
| 5,796,505 A | * | 8/1998 | Ushirozawa ................. 359/160 |
| 5,801,877 A | * | 9/1998 | Yoneyama ................... 359/341 |
| 5,973,808 A | * | 10/1999 | Sekimura et al. ........... 359/124 |

FOREIGN PATENT DOCUMENTS

| | | |
|---|---|---|
| JP | 61-148890 | 7/1986 |
| JP | 3-130723 | 6/1991 |
| JP | 4-263228 | 9/1992 |
| JP | 5-102515 | 4/1993 |
| JP | 6-21578 | 1/1994 |
| JP | 6-169124 | 6/1994 |
| JP | 7-66480 | 3/1995 |
| JP | 7-230066 | 8/1995 |
| JP | 7-326820 | 12/1995 |
| JP | 8-86986 | 4/1996 |
| JP | 8-152361 | 6/1996 |
| JP | 9-181682 | 7/1997 |

OTHER PUBLICATIONS

Electronics Letters, vol. 34, No. 24, Nov. 23, 1995, "MQW electroabsorption optical modulator for 40 Gbit/s modulation", T. Ido et al, pp. 2124–2125.

* cited by examiner

Primary Examiner—John Tweel
(74) Attorney, Agent, or Firm—Mattingly, Stanger & Malur, P.C.

(57) ABSTRACT

Configurations of a light signal communication apparatus and an optical communication system suitable for speeding-up of the transmission of information based on a light signal and an increase in the capacity for the information transmission are disclosed. On the light signal transmitting side, excitation light is supplied to an active medium in accordance with a transmission signal to cause induced emission within the active medium, thereby generating signal light. The excitation light causes spontaneously-emitted light to fall on a semiconductor layer, and a voltage pulse corresponding to transmission information is applied to modulate the refractive index of the semiconductor layer, thereby Bragg-reflecting a specific wavelength component, after which it is sent to the active medium as the excitation light. The Bragg reflection and induced emission incident to it exhibit excellent response to a voltage signal having a pulse width of $1\times10^{-9}$ seconds or less. It is therefore possible to implement an optical communication system having a transmission rate up to 100 Gb/s with one light signal.

12 Claims, 21 Drawing Sheets

OPTICAL COMMUNICATION EQUIPMENT AND SYSTEM

TECHNICAL FIELD

The present invention relates to an information communication technique using light signals and to an optical communication apparatus and an optical communication system suitable for speeding-up of signal transmission and an increase in the capacity for the transmission of a signal or an increase in reliability of signal transmission.

BACKGROUND ART

The development of research toward the speeding-up of signal transmission and an increase in the capacity for the signal transmission has recently been active in an information communication technique (hereinafter called optical transmission technique) which performs the transmission of a light signal through an optical fiber. An optical communication system wherein the transmission rate reaches about 2.4 Gb/s (giga-bit/s) at present, has been put into practical use upon the transmission of a light signal between base stations (communication equipment centers), for example. Further, the development of research intended for a high-speed capacity increase of 40 Gb/s or more is in progress.

On the other hand, the introduction of a so-called optical communication system for replacing a transmission signal with light is proceeding even at information communications made between base stations and users (home, office, etc.), and an increase in the reliability of an optical network unit (ONU) on the user side remains a problem. This problem is of importance even to an optical communication apparatus adopted in the transmission of a light signal between the base stations.

The speeding up of the light signal and the great increase in the capacity for the transmission thereof in the optical communication system are problems which are integrally inseparably related to each other. The above-described transmission rate is known as one reference for evaluating these performance. Parameters for improving the transmission rate exist in specifications of, for example, a transmitting device or transmitter for transmitting a light signal, a receiving device or receiver for receiving the light signal therein, and a signal processing device for converting the received signal to an electric signal or decoding it. As to the transmitting device, the shortening of each pulse of a light signal generated according to an electric signal (including an electric signal temporarily converted from a signal inputted by light) without impairing the S/N ratio (signal-to-noise ratio) is taken as one parameter (the present parameter will hereinafter be called "first viewpoint"). Further, one of other parameters is that a plurality of light signals different in wavelength from each other are used and signals to be transmitted are distributed and transmitted every wavelength (hereinafter the present parameter will hereinafter be called "second viewpoint"). Thus, the background art related to the improvement in the transmission rate in the optical communication system will be viewed from the first and second viewpoints respectively and summarized below.

1. First Viewpoint (Shortening of Pulse of Light Signal)

In view of trends of the background art from the first viewpoint, an improvement in performance of a so-called optical modulator for modulating light oscillated from a laser light source according to a transmission signal is now mainstream. The present optical modulator is constructed as a so-called semiconductor optical device formed by stacking semiconductor layers on each other. Most of the optical modulators are (monolithically) formed over the same substrate as a semiconductor laser device used as the laser light source. Most of these optical modulators intermittently apply an electric field to a semiconductor layer (hereinafter called "wave-guiding layer") for wave-guiding laser light or a semiconductor layer (hereinafter called "cladding layer") jointed thereto, modulate an absorption coefficient of at least one of the semiconductor layers with respect to the laser light, and repeat transmission and cutting off of a light signal incident to an optical fiber corresponding to a signal transmission line.

The principle of operation of this type of optical modulator is that a forbidden band width Eg of each semiconductor layer is reduced by the application of the electric field, and the semiconductor layer is allowed to absorb light having a much longer wavelength as compared with light $\lambda g$ of the longest wavelength (corresponding to the forbidden band width of the corresponding semiconductor layer) originally absorbable by the semiconductor layer. This principle will be explained typically with reference to FIG. 23. The following relation is established between a forbidden band width Eg (unit: eV) of each semiconductor layer and the longest wavelength $\lambda g$ (unit: $\mu m$) of light absorbed thereby:

$$Eg = 1.24/\alpha g \qquad \text{(equation 1)}$$

When the non-applied state of the electric field or the strength of the applied electric field is sufficiently small as shown in FIG. 23(a), Eg of the semiconductor layer is determined according to the difference between an upper end Va of an energy level in a valence band and a lower end Ca of an energy level in a conduction band. If the absorption of the light by the semiconductor layer is discussed by band-to-band transition alone, then the light incident to the semiconductor layer transitions electrons in the valence band to the conduction band by its own energy, so that the light is absorbed into the semiconductor layer. Therefore, light of energy (wavelength longer than $\lambda g$) lower than Eg is not substantially absorbed. However, when the electric field to be applied to the semiconductor layer is strengthened, respective degeneration of the energy levels are released so that they are split into a plurality of energy levels. This phenomenon is called "Stark effect". As a result of its splitting, the transition of electrons between the valence band and the conduction band due to the energy levels Va2 and Ca1 is newly added. Since an energy difference Eg' between the levels is smaller than Eg, the range of the wavelength of the light absorbed by the corresponding semiconductor layer is shifted to the long-wave side up to $\alpha g'$ equivalent to Eg'.

On the other hand, when the degree of the absorption of light by the semiconductor layer depends on an absorption coefficient a and light having an intensity $I_0$ enters into the semiconductor layer by a distance x, a light intensity I(x) attenuated by the absorption of the semiconductor layer is represented like the following equation:

$$I(x) = I_0 \exp\{-\alpha x\} = I_0 \exp\{-2\omega\kappa x/c\} \qquad \text{(equation 2)}$$

where $\omega(s^{-1})$ indicates an angular frequency ($\omega = 2\pi\nu$, $\nu$: a light's wave number), $\kappa$ (dimensionless) indicates an attenuation coefficient (also called extinction coefficient), and c indicates the velocity of light in vacuum (about $3.0 \times 10^8$ m/s), respectively. The extinction coefficient is a parameter indicative of an imaginary part of a refractive index ($n + i\kappa = C/v$, v: the velocity of light traveling or propagating in a medium) of the medium accompanied by light absorption.

The absorption coefficient α depends on the energy (hv) of light as shown in FIG. 23(b). The absorption coefficient a satisfies the relations in the following equation in a state free of the splitting of the above-described energy levels (it is illustrated as a curve a). Here, h indicates a Planck constant (about $6.63 \times 10^{-34}$ J·s).

$$\alpha \propto (hv-Eg)^{1/2}/\omega \qquad \text{(equation 3)}$$

On the other hand, when the energy levels are split, the relationship between α and hv is illustrated as a curve b in which the rise of the curve is shifted to Eg' lower in energy than Eg. Eg' is further shifted to the low energy side as the strength of an electric field to be applied increases.

Of the conventional optical modulators, the principle of the above-described light absorption has been generally used in one which utilizes a wave-guiding channel of each semiconductor layer. In this case, the wave guide layer for wave-guiding a light signal of wavelength λsig (energy Esig) is composed of a semiconductor material in which the forbidden band width Eg at the non-application of the electric field takes Eg ≧ Esig, and the forbidden band width of the wave guide layer or the cladding layer joined thereto is set smaller than Esig to absorb the light signal. As indicated by the curve b of FIG. 23(b), the absorption coefficient a at the application of the electric field on the side of low energy less than Eg is smaller than that on the side of high energy greater than Eg. However, the modulation performance sufficiently adoptable in the optical communication system has already been achieved.

The conventional optical modulator has been disclosed in, for example, Japanese Patent Application Laid-Open Nos. Hei 7-230066 and 8-86986. A technique related to this has been described even in U.S. Pat. No. 4,826,295. Further, a (monolithic) optical apparatus in which a semiconductor optical modulator is formed over the same substrate as a semiconductor laser light source, has been disclosed in, for example, Japanese Patent Application Laid-Open Nos. Hei 6-21578 and 9-181682. The light signal modulation technology described in these publications lies within the level of the practical use at present. It is reported that at the study level, a light signal modulation of 50 GHz at maximum is obtained by a technique related to the optical modulator described in Japanese Patent Application Laid-Open No. Hei 7-230066 (T. Ido, et al, "ELECTRONICS LETTERS", Vol. 31, No. 24 (1995), pp. 2124–2125). This record data has been put on the stage as a support of the implementation of the optical transmission at the transmission rate of 40 Gb/s. However, there is no report that this modulation frequency has been reproduced subsequently, to say nothing of the data for updating this record.

The present inventors have interpreted the cause by reference to FIG. 24 as follows. A conventional semiconductor optical modulator 200 is constructed such that a wave guide layer 203 and cladding layers 202 and 204 interposing it therebetween and having conduction types opposite to each other are stacked over a semiconductor substrate 201, and electrodes 205 and 206 are formed over upper and lower surfaces of a laminated structure including the semiconductor substrate so as to interpose the laminated structure therebetween. Namely, this laminated structure would become a diode having a pn type or pin type junction. Since a modulation electric field is applied to the electrodes provided at the upper and lower positions of the laminated structure in a direction opposite to the pn type or pin type junction, the semiconductor optical modulator would become one capacitive element (capacitor). The capacitance C thereof is given from permittivity ∈ of the entire laminated structure, the thickness d thereof in the laminated direction, and an electrode area S as follows:

$$C = \in S/d \qquad \text{(equation 4)}$$

The electric field is applied between the electrodes of the semiconductor optical modulator intermittently, e.g., in pulse form according to signal information to be transmitted. On the other hand, the capacitance C serves as the time constant with respect to a light signal modulation circuit including the corresponding optical modulator. Thus, when the modulation frequency increases, the influence of slow-down in the response of formation and erasure of the modulation electric field in the laminated structure becomes large so that the implementation of desired optical modulation falls into difficulties.

On the other hand, the structure of an optical device or element of a type wherein a semiconductor optical modulator is fabricated in a resonator of a semiconductor laser, has been disclosed in Japanese Patent Application Laid-Open No. Hei 6-169124. An outline of a cross section thereof extending in the direction of the resonator (i.e., in an oscillating direction of laser light) is shown in FIG. 25. According to the present optical device, a modulation layer 213, a second conductivity type second semiconductor layer 214 opposite to a first semiconductor layer, an active layer 215 (light emitting region), first conductivity type third and fourth semiconductor layers 216 and 217, and a second electrode 218 are laminated over the upper surface of the first conductivity type first semiconductor layer 212 in this order. Further, a voltage V1 is applied between the second semiconductor layer 214 and the fourth semiconductor layer 217 in pulse form, and a voltage V2 is applied between the first semiconductor layer 212 and the second semiconductor layer 214 in pulse form, respectively. V1 is applied in the forward direction with respect to the junction direction of the conductivity type in the laminated structure, whereas V2 is applied in the reverse direction with respect to it. The former controls a light-emission phenomenon developed in the active layer and the latter controls absorption of light produced from the active layer 215 into the modulation layer 213, respectively. A pulse phase control line (not shown) is provided between power supplies or sources 221 and 222 (current supply source for V1) for V1 and V2. Both the power supplies apply voltage pulses to each individual layer of the laminated structure at equal intervals and with a predetermined phase difference. Since the laser light intermittently generated by the application of the pulse voltage V1 (pulse current incident to it) is absorbed by the modulation layer according to the turning on or off of the pulse voltage V2 during the former or latter half of its generation time, the time-axial width of the pulsed laser light becomes short by an absorption time interval.

As described above, the method of intermittently supplying a laser driving current produced from each power supply and thereby modulating laser oscillations is called "direct modulation scheme or system". In the direct modulation system, the response of the laser oscillations in pulse form to the voltage signal V1 (driving current) is placed under the influence of the life of a carrier related to an oscillated threshold current and a light-emission phenomenon of laser light, and the generation and extinction of the laser light are respectively delayed with respect to the turning on/off of the voltage signal (driving current) (this phenomenon is called "oscillation delay"). An oscillation delay time interval is about $10^{-9}$s (seconds) if described specifically. Therefore, when a serial type optical communication system is constructed by the direct modulation scheme, the limit of the transmission rate would become 1 giga-bit/s ($10^9$bit/s) or less.

A summary of the oscillation delay will be explained with reference to FIG. 8. Output delays of a light signal 61 with respect to the input (injection of driving current) of a voltage signal 60 are different from each other according to on/off intervals of the voltage signal as in the case of Δt1, Δt2, Δt3 and Δt4. This is because the oscillation delay time interval is taken to experience the effect of storing or accumulating the carriers injected into the active layer. Variations in delay time appear even in the delay of extinction of the light signal subsequent to the cutting-off of the voltage signal (driving current). Thus, even if the timing provided to recognize the signal on the light signal receiving side is shifted a predetermined time to prevent misrecognition of the transmission information on the light signal receiving side, a problem on its misrecognition cannot be essentially resolved. Further, even if so-called tailing of the laser light due to the delay of the extinction of the light signal with respect to the off time of the voltage signal is absorbed by the modulation layer disclosed in Japanese Patent Application Laid-Open No. Hei 6-169124, there is a possibility that this will be absorbed before the strength of the light signal with respect to the input of the voltage signal sufficiently rises. This falls short of solving the problem on the misrecognition of the transmission information.

2. Second Viewpoint (Multi-Waving of Light Signal):

In view of trends of the background art from the second viewpoint, for example, a wavelength variable type semiconductor laser is adopted in a signal light source to thereby set the wavelength of a light signal to a desired value according to the type of signal (information) to be transmitted. Most of optical fibers each constituting a signal transmission line absorb light incident thereto, and the amount of its absorption depends on the wavelength of light. Further, each optical fiber deforms profiles extending in time-axis and wavelength-axis directions of pulse light incident thereto and propagated therethrough by its own dispersion effect. Thus, when a plurality of light signals different in wavelength are transmitted through one optical fiber, there are demands for the restriction of the range of the wavelength of the signal light with respect to the light absorption and the proper setting of intervals between the wavelengths of the plurality of signal lights with respect to the deformation of each light pulse. The wavelength variable type semiconductor laser is a light source which meets these demands.

One of the wavelength variable type semiconductor lasers has been disclosed in Japanese Patent Application Laid-Open No. Sho 61-148890. An outline of a cross section thereof in the direction of a resonator thereof is shown in FIG. 26. This semiconductor laser is constructed in the following manner. An active layer 233 and crystal layers 234 (hereinafter abbreviated as "electrooptic effect layers") each composed of a material showing an electrooptic effect are formed over the upper surface of an N type semiconductor substrate 232 with an electrode layer 231 provided on the lower surface thereof so that the former is interposed between the latter layers. A P type semiconductor layer 235 is further formed over the upper surface of the active layer, and an electrode layer 236 is formed over the upper surface of the P type semiconductor layer 235. On the other hand, a plurality of electrodes 237 (grid electrodes) are formed over the upper surface of the electrooptic effect layer 234 so as to be spaced away from each other and placed side by side in the resonator direction. The electrooptic effect layer 234 is formed of a material whose refractive index changes according to an electric field applied from each electrode 237 formed over the upper surface thereof and which is transparent to the light produced by the active layer.

When an electric field is formed between one set of adjacent grid electrodes 237, a refractive index change 238 occurs in an electric field application part of each electrooptic effect layer (this part will hereinafter be called "refractive index change part"). When each electrooptic effect layer 234 is formed of $LiNbO_3$, a field strength necessary to form each refractive index change part 238 is about $1V/\mu m$. When the refractive index change parts 238 are formed at predetermined intervals a, a periodic refractive index distribution appears on the upper surface side of each electrooptic effect layer 234. This refractive index distribution selectively reflects light of wavelength λ satisfying the following relation of light incident from the active layer to the electrooptic effect layer 234, toward the active layer.

$$a = N\lambda/2n_{eff} \quad \text{(equation 5)}$$

where N indicates a natural number, and $n_{eff}$ indicates an effective refractive index of each electrooptic effect layer 234. The periodic refractive index distribution functions as a diffraction grating. As viewed from the example shown in FIG. 26, the light reflected by the right electrooptic effect layer 234 is longer in wavelength than the light reflected by the left electrooptic effect layer 234. Although the respective periodic refractive index distributions of the left and right electrooptic effect layers are made different from each other in FIG. 26 for description, the left and right periodic refractive index distributions are normally formed equally, whereby induced emission occurs in the active layer with respect to the wavelengths reflected from the left and right electrooptic effect layers 234, thus oscillating or producing laser light of the wavelengths referred to above.

The refractive index change due to the field application at the semiconductor laser results from the electrooptic effect. As a material which makes up of the electrooptic effect layer 234, may be used a semiconductor material such as GaAs or the like in addition to $KH_2PO_4$, $(Pb.La)(Zr.Ti)O_3$. It is necessary to cause the optical axis of each electrooptic effect layer, the direction (which is indicated by arrow at the lower portion of each refractive index change part) of an electric field formed by each grid electrode, and the direction (along the wave-guiding direction) of an electric field for inductively emitted light to coincide with each other for the purpose of improving the selectivity of the wavelength of each inductively emitted light according to the refractive index. Therefore, a potential difference must be provided between the grid electrodes 237 adjacent to each other as shown in FIG. 26. It is thus disadvantageous in terms of insulation between bonding wires for supplying voltages to the grid electrodes. Further, the present publication does not discuss in particular, the follow-up or response of laser light oscillations to the electric field applied to each grid electrode when the laser light is (intermittently) oscillated in pulse form by the semiconductor laser.

On the other hand, Japanese Patent Application Laid-Open No. Hei 7-326820 discloses a wavelength variable type semiconductor laser similar to the device structure disclosed in Japanese Patent Application Laid-Open No. Hei 6-169124. Its structure will be explained with reference to FIG. 25. Conductivity type of each semiconductor layer constituting a device or element roughly corresponds to that described in Japanese Patent Application Laid Open No. Hei 6-169124 but is different therefrom in that the above-described modulation layer is used as an active layer (light emitting region) and the above-described active layer is used as a tuning layer. The tuning layer and the active layer might be replaced in layout by each other. However, a description will be continuously made in the former case.

An electric field V1 applied from a second semiconductor layer 214 to a fourth semiconductor layer 217 via a tuning layer 215 by a power supply or source 221 in the direction opposite to a conductivity type sequence changes the refractive index of a semiconductor material which constitutes the tuning layer. On the other hand, a power supply 222 supplies a current as a current supply source under a voltage V2 applied from a first semiconductor layer 212 to the second semiconductor layer 214 via an active layer 213 in the forward direction with respect to the conductivity type sequence. In the semiconductor laser shown in FIG. 25, light of wavelength reflected by a diffraction grating 219 formed between a third semiconductor layer 216 and the fourth semiconductor layer 217, of lights produced by injecting a current into the active layer 213, is returned to the active layer 213 from which the light of the wavelength is inductively emitted. When an uneven cycle of the diffraction grating 219 is set as a, the light returned to the active layer 213 thereby has a wavelength λ which satisfies the above (equation 5). At this time, the above-described $n_{eff}$ is defined as an effective refractive index of the active layer 213. However, the value thereof is placed under the influence of the refractive index of each of the semiconductor layers interposing the active layer 213 therebetween. Therefore, a change in the refractive index of the tuning layer 215 determines the oscillation wavelength of the semiconductor laser as a change in $n_{eff}$.

However, the present publication does not discuss in particular, the follow-up or response of the change in $n_{eff}$ to the applied field V1, i.e., the follow-up of the oscillation of laser light having a desired wavelength when the laser light is (intermittently) oscillated in pulse form by the semiconductor laser.

Thus, since the aforementioned wavelength variable type semiconductor laser has no attention to the oscillation of the laser light in pulse form under the control of the laser oscillation conditions, the use of the semiconductor laser in an optical communication system operated at a transmission rate of 1 Gb/s per wavelength needs to provide optical modulating means starting with the aforementioned semiconductor optical modulator at a stage subsequent to a resonator for laser oscillations.

DISCLOSURE OF INVENTION

It can be concluded that if the background art is generally summed up from the viewpoints 1 and 2, the generation of a light signal by each semiconductor optical modulator is essential to the speeding up of signal transmission and an increase in the capacity for the signal transmission in an optical communication system in terms of an improvement in the transmission rate. However, the semiconductor optical modulator is restricted in its modulation frequency in terms of its structure as discussed in the background art. Therefore, a problem remains with a view toward putting the optical communication system having a transmission rate of 20 Gb/s or more per wavelength into practical use. Thus, a wavelength division multiplexing (abbreviated as "WDM") system for transmitting a plurality of light signals different in wavelength by one optical fiber should be inevitably adopted upon putting an optical communication system having a transmission rate of 20 Gb/s or more, particularly, a transmission rate of 40 Gb/s or more at which an effect is expected upon the speeding up of signal transmission and an increase in capacity therefor, into practical use.

Meanwhile, an example for simultaneously generating a plurality of lights having wavelengths by one resonator is not disclosed in the conventional semiconductor laser. Therefore, there has been a demand for the placement of semiconductor laser elements or devices on the signal transmitting side in parallel to a signal transmission line (optical fiber) according to wavelengths of light signals upon constructing the optical communication system using the wavelength division multiplexing system. It is important upon avoiding misrecognition of transmission information on the light signal receiving side that light signal transmitters (each including a semiconductor laser or a device with the semiconductor laser and an optical modulator placed in mixed form, and an optical module) provided all wavelengths are driven in synchronism with each other in the so-called parallel type optical communication system for dividing one transmission information into the light signals of plural wavelengths and transmitting them. However, the conventional optical communication system including the direct modulation scheme described in the background art has no attention to a reduction in variations in transmission delay time of light signals, which occur between the plurality of light signal transmitters. When a light signal of 1 Gb/s or more is transmitted from each of these light signal transmitters, it was difficult to provide synchronization between the light signal transmitters.

Further, in an optical communication system wherein each light signal transmitter is constructed by utilizing a semiconductor laser and an optical modulator in combination, laser light oscillated continuously from the semiconductor laser is modulated by the optical modulator according to transmission information (e.g., by performing switching between on and off) so that the transmission information is converted to a light signal. Namely, it is necessary to always supply a current of a so-called oscillation threshold or more necessary for the oscillation of the laser light to the semiconductor laser and apply a voltage corresponding to the current thereto. Therefore, the light signal transmitter raises the temperature of its own operating environment according to power to be used up or consumed. A temperature range of the operating environment of the light signal transmitter is maintained at a temperature of from −40° C. to +70° C. However, the wavelength of the laser light produced from the semiconductor laser slightly varies according to the temperature even in the case of this temperature range. Such a wavelength variation brings about misrecognition of transmission information on the receiving side in an optical communication system for identifying the transmission information by the wavelength. The wavelength division multiplexing type optical communication system will mistake the light signal of wavelength to be recognized. Most of the present light signal transmitters are respectively provided with temperature control means such as Peltier elements or the like to generate light signals stably with respect to a change in temperature. However, in a terminal (such as the ONU or the like) on the user side, which is hard to become careful of the environment, particularly, temperature management used for the light signal transmitter, the operating environment temperature will exceed the temperature range even in the case of the light signal transmitter added with the temperature control means. Even in the case where the temperature is simply raised by 10° C. from an upper limit value of +70° C. to +80° C., the rise in the environment temperature greatly fails to stabilize the wavelength of the light signal of the light signal transmitter.

An object of the present invention is to improve a transmission rate of a light signal employed in the optical communication system (also called "optical transmission system"). In order to achieve this object, one of the present inventions constructs or constitutes an optical communication apparatus capable of transmitting one type of light signal (signal light having one wavelength) at a transmission rate of 20 Gb/s more with satisfactory reproducibility (first invention). The first invention also provides the construction of an optical communication system which performs high-speed and high-capacity information transmission without having to use the wavelength division multiplexing system. Further, in order to achieve the above object, another one of the present inventions constitutes an optical communication apparatus suitable for providing synchronization between a plurality of types of light signals different in wavelength in an optical communication system for dividing transmission information into the plurality of types of light signals (signal lights of plural wavelengths) and transmitting the respective light signals at a transmission rate of 1 Gb/s or more (second invention).

Another object of the present invention is to improve the reliability of signal transmission in an optical communication system from the viewpoint of the wavelength of a light signal. In order to achieve the above object, the present invention constructs an optical communication apparatus and an optical communication system both capable of sufficiently controlling instability of a signal wavelength due to a rise in temperature on the light signal transmission side (third invention).

In any of the above-described first through third of the present inventions, laser light capable of greatly setting power inputted to an optical fiber corresponding to a signal transmission line is used as a light signal. The concept common to the respective inventions is to inductively emit signal light from each light signal transmitter, i.e., intermittently performing so-called laser oscillations according to a transmission signal. The concept of execution of the induced emission of the signal light from the light signal transmitter according to the transmission signal inputted thereto is similar to the technique described in Japanese Patent Application Laid-Open No. Hei 6-169124. However, the present invention is different from it in that the direct modulation scheme or system for modulating the current to be supplied to the laser oscillation unit is not adopted. In the present invention, (1) light is produced by spontaneous emission, i.e., light emission based on the so-called principle of operation of a light emitting diode, (2) a desired wavelength component (signal wavelength) of this light is supplied to a resonator for oscillating or producing laser light or a part (hereinafter called "laser light producing unit") corresponding to it according to a transmission signal as so-called pumping light (excitation light), and (3) induced emission based on the desired wavelength component is produced by the resonator.

A summary of the aforementioned phenomenon of spontaneous emission will now be explained by an example of a light emitting diode (LED). The light emitting diode is comprised of a laminated structure of semiconductors each composed of a p-n junction or a p-i-n junction. The emission phenomenon occurs due to the diffusion of electrons and positive holes at the time that the voltage is applied to the conductivity type of junction referred to above in the forward direction, and their coupling. Therefore, the density $J[A/m^2]$ of the total current in the forward direction (moving from a p type layer to an n type layer) which flows through the junction, is defined by the following equations:

$$J=J_0\{\exp(qV/kT)-1\} \quad \text{(equation 6)}$$

$$J_0=qD_hp_{n0}/L_h+qD_en_{p0}/L_e \quad \text{(equation 7)}$$

$$L_e=(D_e\tau_e)^{1/2} \quad \text{(equation 8)}$$

where q indicates an electrical change of an electron ($1.6022 \times 10^{-19}$ C), V indicates a potential difference in the forward direction, k indicates a Boltzmann constant ($1.381 \times 10^{-23}$ J/K), T indicates the temperature [K], and $n_{p0}$ ad $P_{n0}$ respectively indicate densities [$m^{-3}$] of an electron in a p region and a positive hole (so-called minority carrier) in an n region in a thermal equilibrium state. Further, $L_e$, $D_e$ and $\tau_e$ respectively indicate a diffusion distance [m], a diffusion coefficient [$m^2/s$] and a life [s] of an electron in the p region. Those whose suffix letters e are replaced by n, respectively indicate a diffusion distance, a diffusion coefficient and a life of a positive hole in the n region. Further, if the life $\tau r[s]$ of recombination accompanied by light emission based on the electron and positive hole is constant regardless of the location, then the number of photons $N_p$ generated from the light emitting diode and its internal quantum efficient $\eta$ are respectively given by the following equations:

$$N_p=n_{p0}L_e\{\exp(qV/Kt)-1\}/\tau_r \quad \text{(equation 9)}$$

$$\eta=qN_p/J \quad \text{(equation 10)}$$

In a normal semiconductor laser (laser diode), a resonator for oscillating or producing laser light is made up of a semiconductor material and a region (active region) composed of an active medium is provided thereinside. The semiconductor laser is identical in function to a light emitting diode taken in a broad sense in that the aforementioned light emission phenomenon is produced by the injection of the current into the corresponding active region and the produced light is distributed over a certain wavelength range, but is different therefrom in that the above-described resonator is constructed so that a specific wavelength component of produced light is returned to an active region to thereby cause an induced emission phenomenon in the active region (e.g., a Fabry-Perot type structure interposing an active medium between reflecting mirrors is adopted). Namely, the semiconductor laser generates excitation light necessary for the induced emission by light produced inside its own resonator. Further, a current of a given value or more must be injected into the active region to obtain the excitation light necessary for the induced emission (this current value is called "threshold current" for the oscillation of laser light). It is necessary to apply an electric field of a voltage or more equivalent to the threshold current value to the semiconductor laser according to a current-voltage characteristic at the oscillation of laser light inherent in the semiconductor laser upon the injection of the current into the active region. It is needless to say that no laser light is produced under the condition in which the current injected into the active region of the semiconductor laser falls below the threshold. Further, the emission of the spontaneously-emitted light produced inside the resonator to the outside of the resonator is also very weak. It is therefore essential that the current greater than or equal to the threshold is supplied to the active region upon driving the semiconductor laser. Correspondingly, a consumption current increases and the peripheral temperature of the semiconductor laser also rises with its increase. In an optical communication system for transmitting a light signal at a transmission rate of 1 Gb/s or more, laser light normally oscillated from a semiconductor laser is intermittently cut off by field absorption or the like according to a transmission signal through the use of an optical modulator provided at a stage (on the signal transmission line side) subsequent to the semiconductor laser, thereby generating a light signal. Therefore, about the half of the current injected into the semiconductor laser is discarded by the cutting off of the laser light by the optical modulator.

On the other hand, the optical communication apparatus (signal transmitting terminal) is identical to the conventional semiconductor laser in that light used as a species for laser oscillations, i.e., photons are generated by the spontaneous emission through the use of a semiconductor light emitting element or the like, but is different therefrom in the principle that a photon having specific energy (wavelength) is supplied to a laser light generating unit as excitation light for induced emission. In the conventional light signal transmitter comprised of the combination of the semiconductor laser and the optical modulator as described above, the oscillations of the laser light by the induced emission and the generation of the light signal according to the transmission information are separately performed by the former and latter. This technique idea is identical to the semiconductor optical device disclosed in Japanese Patent Application Laid-Open Nos. Hei 6-21578 and 9-181682 wherein the two are monolithically formed. Further, it is inferred that the intention for separating both functions be included in a structure wherein a diffraction grating (having the function of selecting an oscillation wavelength) provided in a DFB-LD unit (laser light generating unit) of each of the devices disclosed in these publications is prevented from extending to an EA-MOD unit (optical modulator). In contrast to the conventional optical communication system for modulating the intensity of the thus inductively-emitted laser light according to the transmission information, the present invention has a great feature in that the intensity or wavelength of the excitation light related to the induced emission is modulated. In other words, the optical communication apparatus or system according to the present invention is constructed so as to change the induced emission condition of the laser light according to the transmission information.

Meanwhile, the optical communication apparatus and system according to the present invention need to ensure the transmission rate of the light signal at 1 Gb/s or more at minimum. Namely, the present invention needs to modulate the intensity or wavelength of the excitation light supplied to the laser light generating unit in a cycle of $10^{-9}$s (seconds) or less. It is needless to say that this demand cannot satisfy the induced emission described in the background art by the injected current-based direct modulation scheme. It is also difficult to satisfy this demand even by a distributed Blagg reflection type (DBR type) resonator or a distributed feedback type (DFB type) resonator utilizing the generation and extinction of a diffraction grating by the electrooptic effect disclosed in Japanese Patent Application Laid-Open No. Sho 61-148890, i.e., Pockels effect, Kerr effect or the like. However, the present inventors have conceived a new method of modulating induced emission condition, which is different in principle from the direct modulation scheme and the electrooptic effect, and have found that the intensity or wavelength of the excitation light supplied to the laser light generating unit can be modulated even in a short cycle of $10^{-9}$s or less. The present inventors will first introduce the concept of an optical communication apparatus (signal transmitting terminal) according to the present invention by reference to one example shown in FIG. 1 and will next explain the summary of the principle of a new method of modulating an induced emission condition for signal light, according to the present invention in association with the functions of the optical communication apparatus and optical communication system.

An optical communication apparatus 10 used as a light signal transmission apparatus shown in FIG. 1(a) is separated into three sections of a light signal transmitter or transmission unit 1, a noise eliminator 2 and a light signal amplifier unit 3. A light signal produced from the light signal transmission unit 1 passes through the noise eliminator 2 and the light signal amplifier unit 3 via an optical fiber 20, followed by transmission to a signal transmission line (optical fiber). The light signal transmission unit 1 includes, as principal component requirements, a signal light generating unit (laser light generating unit) 15 including a light emitting portion and an induced emission condition controller (both not shown), a power supply 11 for supplying a current necessary for spontaneous emission at the light emitting portion, and a signal source 12 for inputting transmission information to the induced emission condition controller. The signal source 12 receives transmission information sent from users 12a and 12b therein and sends an electric signal to the induced emission condition controller so as to modulate an induced emission condition of the light signal transmission unit 1 according to the transmission information. The noise eliminator 2 is provided to cut off light incident from the signal transmission line to the optical communication apparatus 10 and prevent spontaneously emitted light produced in the light signal transmission unit 1 from leaking to the signal transmission line. For the purpose of the former, an optical isolator is constructed which comprises a polarized-plane rotator using the Faraday effect. The optical isolator comprises a polarizer 21 in which the direction of rotation of a polarized plane thereof with respect to a magnetic field is 0°, a magneto-optic rotator (rod-like lens composed of a material such as $Y_3Fe_5O_{12}$ (YIG) or the like) in which the direction of rotation of its polarized plane is 45°, and an analyzer 23 in which the direction of rotation of its polarized plane is 45°. For the purpose of the latter, a metal film such as nickel (Ni) or chromium (Cr) or the like is evaporated on the light signal transmission unit 1 side of the magneto-optic rotator 22 to form an optical attenuator 24. The optical attenuator 24 sets the material of the metal film and the evaporated thickness thereof according to the extent that spontaneously emitted light formed as noise is attenuated relative to a signal of laser light. Although the optical attenuator 24 is not fabricated and built in the optical isolator, any forming position may be used if placed over an optical path which connects the light signal transmission unit 1 and the light signal amplifier unit 3 to each other. The metal film may be formed on, for example, a lens or the like optically coupled to the optical isolator. The light signal amplifier unit 3 is provided to avoid a loss of a light signal intensity within the signal transmission line before the light signal (laser light) is launched into the signal transmission line. In the example shown in FIG. 1(a), a light source 33 for generating excitation light for exciting an active medium placed within the fiber, a power supply 31 for operating the light source, and a directional coupler 36 for combining the signal light sent from the light signal transmission unit 1 with the excitation light and sending the combined one to an optical fiber amplifier 35 are placed in a preceding stage (on the light signal transmission unit 1 side) with the optical fiber amplifier 35 as the center, and an optical detector 34 for monitoring an amplified state of the fiber amplifier, a power supply 32 for activating the optical detector 34 and a directional coupler 37 for taking out light to be monitored from the optical fiber 20 are placed in a subsequent stage (on the signal transmission line side), respectively.

The modulation of the induced emission condition for the light signal employed in the optical communication apparatus of the present invention illustrated by way of example in FIG. 1(a) is based on the input of the electric signal from the signal source 12 to the induced emission condition controller included in the signal light generating unit 15 of the light signal transmission unit 1. FIG. 2 shows two types of specific examples of the signal light generating unit 15 as cross sections taken along the oscillating direction of the laser light. Both are semiconductor devices each constructed such that an n type first semiconductor layer 102, an active region 103 composed of a semiconductor material, which is smaller in forbidden band width than the first semiconductor layer, a p type second semiconductor layer 104 larger in forbidden band width than the active region, and a p type third semiconductor layer 105 different in refractive index from the second semiconductor layer are stacked over an n type semiconductor substrate 101 in this order. In both the semiconductor devices, electrode layers 106 are respectively formed over the lower surfaces of the semiconductor substrates 101. Requirements satisfied to allow the semiconductor layer 103 to function as the active region are to combine a forbidden band width small as compared with the semiconductor layers 102 and 104 joined to each other as viewed in the vertical direction with a refractive index large as compared therewith. The active region 103 might be constructed by a so-called quantum well type structure in which a thin semiconductor layer called quantum well layer is interposed between barrier layers larger in forbidden band width than the semiconductor layer. In this case, however, it is necessary to set the refractive indexes of the quantum well layer and barrier layers so as to be larger than those for the semiconductor layers 102 and 104.

In a semiconductor device corresponding to a signal light generating unit 15 disclosed in FIG. 2(a), a stripe-like electrode layer 107 extending in the oscillating direction of laser light is provided over the third semiconductor layer 105. A potential difference of $\Delta V_1$ is set substantially constant between the electrode layers 107 and 106 by a power supply 11 so that the current is supplied therebetween. Spontaneous emission occurs in the active region 103 owing to the current supply. A plurality of electrode layers 109 are formed over the electrode layer 107 with an insulating layer 108 interposed therebetween so as to be spaced away from each other in the oscillating direction of the laser light. The width of each electrode layer 109, which crosses the oscillating direction of the laser light, is set larger than a stripe width of the electrode layer 107. Further, the electrode layer 106 and the electrode layers 109 are constructed so as to be opposed to each other on both sides of the stripe of the electrode layer 107. An electric field having a potential difference of $\Delta V_2$ is applied between the electrode layer 106 and each electrode layer 109 by a power supply 12. Large and small changes in the potential difference are repeated according to transmission information. In regions 110 developed in the second and third semiconductor layers 104 and 105 so as to correspond to the electrode layers 109, the densities of two-stage patterns thereof depend on the magnitude of a change in refractive index in a refractive index change region in which prosperity and decay are repeated with the changes in the potential difference of $\Delta V_2$. Part of light spontaneously emitted from the active region 103 leaks to the second semiconductor layer 104 adjacent to the active region. Thus, the light having the wavelength satisfying the condition given in the equation 5 described in the background art with respect to each interval a between the refractive index change regions 110 developed in the semiconductor layer so as to be spaced away from each other in the oscillating direction of the laser light is returned to the active region 103, where the induced emission of the light having the wavelength is produced. Namely, in the signal light generating unit 15 illustrated in FIG. 2(a) by way of example, the electrode layers 106 and 107 and the active layer 103 interposed therebetween correspond to a light emitting portion, and the electrode layers 106 and 109 and the active region 103 interposed therebetween correspond to an induced emission condition controller or control portion, respectively.

Further, a semiconductor device used as a signal light generating unit 15 disclosed in FIG. 2(b) is common to the semiconductor device shown in FIG. 2(a) in principal component requirements but is different therefrom in that a light emitting portion 151 including the active region 103 interposed between the electrode layers 106 and 107, and an induced emission condition controller or control portion 152 including the active region 103 interposed between the electrode layers 106 and 109 are respectively formed so as to be separated into the right half and the left half from each other, and a dielectric film 153 for setting a reflection power of a right end surface lager than that of a left end surface is formed over the right end surface. In the light emitting portion 151, a semiconductor layer, so-called contact layer 111 smaller in forbidden band width than a third semiconductor layer or higher in impurity density than that is formed between the third semiconductor layer 105 and the electrode layer 107. The electrode layer 109 formed in the induced emission condition control portion 152 is not divided along an oscillating direction of laser light. A diffraction grating (irregularities developed in a junction interface) is formed between a second semiconductor layer 104 and the third semiconductor layer 105 located below the electrode layer 109. A high-resistance region 154 formed by Zn ion-implantation or its diffusion or the like is formed between the light emitting portion 151 and the induced emission condition control portion 152. However, this region can be omitted depending on specification conditions of the semiconductor device.

The semiconductor device disclosed in FIG. 2(b) constitutes a Fabry-P³rot type resonator by interposing the light emitting portion 151 between the induced emission condition control portion 152 and the dielectric film 153. Laser light developed by the resonator has a wavelength reflected toward the light emitting portion 151 by the diffraction grating 112 formed in the induced emission condition control portion 152. However, the reflected wavelength changes according to an electric field applied between the electrode layers 106 and 109 of the induced emission condition controller 152.

A method of modulating an induced emission condition for a light signal, according to the present invention will be explained with the above-described semiconductor devices as examples. The method according to the present invention basically makes use of a change in refractive index, which occurs due to the application of the electric field to a crystal of a semiconductor material. This phenomenon is based on the Stark effect described in the section of the background art or a Franz-Keldysh effect in which light incident to the crystal is concerned. These effects, i.e., the former and latter are respectively considered to occur at $10^7$ eV/cm or more and at $10^6$ eV/cm or less according to the applied strength of electric field. Each semiconductor optical modulator described in the background art makes use of the action of absorption of signal light by these effects, a so-called field absorption effect. In each of the optical signal transmitters in which the semiconductor lasers and optical modulators disclosed in Japanese Patent Application Laid-Open Nos.

Hei 6-21578 and 9-181682 are monolithically formed, practically, a current is injected into the semiconductor laser by the application of an electric field corresponding to a voltage of from 1.2V to 1.3V thereto to thereby generate laser light, whereas an electric field corresponding to a voltage amplitude of from 2V to 3V is applied to the optical modulator to modulate the laser light. In the present invention in contrast to this, a voltage signal having a vibrational waveform corresponding to transmission information is applied to the electrode layer constituting the induced emission condition controller of the semiconductor device with the voltage amplitude smaller than the electric field applied to the light emitting portion (while there is also an example in which the relationship between the voltage amplitude of the signal and the field strength is not inevitable in a structure of part of a light signal transmitter to be described later, this relationship is inevitable upon implementation of many optical communication systems according to the present invention). Namely, the voltage signal applied to the induced emission condition controller according to the present invention is much different from that described in the background art in that it is not aimed to modulate the absorption of the laser light.

The present inventors have paid attention to the fact that when an electric field is applied to a semiconductor material in a short time width of $10^{-9}$s or less, the electric field acts within the semiconductor material as an electromagnetic wave, i.e., in a manner similar to light. A vibrational electric field E defined by an angular frequency $\omega$ and an amplitude $E_0$, which is given by the following equation, is applied to a material which exhibits a polarization response of a dielectric or the like:

$$E=E_0\exp\{i\omega t\} \qquad \text{(equation 11)}$$

At this time, an electrical displacement D developed in the material with a phase shift of $\delta$ is given by the following equation:

$$D=D_0\exp\{i(\omega t-\delta)\} \qquad \text{(equation 12)}$$

The permittivity $\in$ of the material becomes a function of an angular frequency $\omega$ of an applied field as represented by the following equation (this will be called "complex permittivity"):

$$\in(\omega)=D/E=\in'(\omega)-i\in''(\omega) \qquad \text{(equation 13)}$$

In the equation 13, $\in'(\omega)$ of the real part indicates the storage of the applied electric field, and $\in''(\omega)$ of the imaginary part indicates a loss developed as thermal energy of the applied electric field by dispersion. Although a detailed description is omitted, when an electric field E vibrated in the form of a sine wave is applied in pulse form, a frequency response function is determined relative to a change in dielectric constant $\in_p$ (pulse response function) responsive to it as given by the following equation:

$$\in(\omega)=\int_0^\infty \in_p(t)\cdot\exp\{i\in t\}dt \qquad \text{(equation 14)}$$

On the other hand, when an electromagnetic wave propagated through the material at a velocity v is absorbed in the material, the material exhibits a complex refractive index n* defined by the following equation:

$$n^*=n-i\kappa=c/v \qquad \text{(equation 15)}$$

where the definition of $\kappa$ and c is identical to one expressed in the equation 2 in the section of the background art. The following relation is established between the complex permittivity $\in(\omega)$ given in the equation 13 and the above complex permittivity:

$$(\in(\omega))^2=n^* \qquad \text{(equation 16)}$$

Thus, the following relations are respectively established between a refractive index n and an extinction coefficient $\kappa$ in a state free of the absorption of the material and between the above $\in'(\omega)$ and $\in''(\omega)$ $$\in'(\omega)=n^2-\kappa^2 \qquad \text{(equation 17)}$$

$$\in''(\omega)=2n\kappa \qquad \text{(equation 18)}$$

A supplemental description will be made of I(x) indicative of the attenuation of the intensity of light in the medium in the equation 2 introduced in the background art. The value of the I(x) is defined as given by the following equation with respect to a field strength E(x) of light propagated through the medium:

$$I(x)=|E(x)|^2 \qquad \text{(equation 19)}$$

If this is replaced by the propagation of the electromagnetic wave in the material, then the above I(x) is equivalent to attenuation along an electric field applying direction (x direction) of a potential difference. Therefore, the above-described equation 2 can be rearranged like the following equation:

$$V(x)=V_2\exp\{x\alpha x\}=V_2\exp\{-2\omega\kappa x/c\} \qquad \text{(equation 20)}$$

Namely, there is a possibility that when a vibrational electric field is applied to a material showing a polarization effect, the potential difference developed in the material by the electric field will show a steep change (attenuation) based on the equation 20, rather than a linear change as the electric field propagates through the material as an electromagnetic wave. It is further apparent from the equations 17 and 18 that a parameter $\kappa$ indicative of the possibility of this attenuation depends on the values of the real and imaginary parts of the complex refractive index of the material, which are determined according to how to apply the angular frequency $\omega$ and pulse of the vibrational electric field, for example.

The present inventors have found out the attenuation of the potential difference expressed in the equation 20 when an electric field having a time width of $10^{-9}$s or less is applied to a semiconductor material with limited voltage amplitude thereof. This attenuation phenomenon will be typically explained with reference to FIG. 3. The right side of FIG. 3 shows a cross-section of an induced emission condition controller of an optical communication apparatus according to the present invention, which is orthogonal to the direction of propagation of a light signal. For simplification of illustration, the semiconductor substrate and third semiconductor layer are omitted from FIG. 2. Further, an electrode layer 109 is directly formed over a second semiconductor layer 104 by the Schottky junction with no insulating layer interposed therebetween. The left side of FIG. 3 shows attenuation of a potential difference developed in a laminating direction of the induced emission condition controller due to an electric field applied between the electrode layers 106 and 109 in the forward direction in such a manner that values normalized at V2 are associated with the center of a refractive index change portion developed in a laminating direction of the right side of FIG. 3. Potentials of 0V and +1V are alternately applied to the electrode layer 109 at intervals of 1×10⁻⁹s in association with the electrode layer 106 which is at a ground potential at all times. When an electric field of +1V is applied to the electrode layer 109 for 1×10⁻⁹s, the potential at the second semiconductor layer is reduced to +1V at a junction interface with the electrode layer 109, +0.1V at the bottom of a refractive index change region 110a, +0.01V at the bottom of a refractive index change region 110b, and +0.001V at the bottom of a refractive index change region 110c, thereby reaching a junction interface with the electrode layer 106 of the first semiconductor layer of ±0V. The degree of a change in the refractive index in a refractive index change region 110 is abruptly reduced according to the reduction in the potential difference and depends on the material for the second semiconductor layer. However, this can be roughly neglected at the bottom of the refractive index change region 110c. Further, the degree of the reduction in the potential difference depends not only on the material for the second semiconductor layer but also on its structure. When, for example, a quantum well structure, i.e., a structure in which materials different in forbidden band width from each other are alternately laminated on one another in a thickness range of from above 2 nm to below 15 nm, is introduced in the vicinity of the bottom of the refractive index change region 110b, the refractive index greatly changes in this region and the extension of the refractive index change region 110c to an active region 103 is reduced shallow (this results from the quantum containment Stark effect).

In the semiconductor device shown in FIG. 2(a), part of the light spontaneously emitted from the active region 103 leaks to the first and second semiconductor layers 102 and 104 adjacent to each other. When refractive index differences are now formed in the second semiconductor layer 104 in cycles of intervals a by the refractive index change portions developed by the application of the electric field, the light having the wavelength component λ satisfying the relation expressed in the equation 5 described in the background art is reflected toward the active region 103. Carriers, i.e., electrons and positive holes exist in the active region 103 due to the current injection but a carrier distribution of the active region 103 is reversed by the excitation developed due to the incidence of the reflected wavelength λ. Thereafter, laser light of wavelength λ is emitted by the recombination of the excited carriers. The above-described phenomenon shows a response excellent in prosperity and decay of each periodic refractive index difference developed by a very short field applying time of 10⁻⁹s or less alone. Even if the field applying time is reduced up to 10⁻¹¹s equivalent to a limited speed of an electrical circuit, for inputting transmission information to a light signal transmitter, i.e., about 100 GHz, a light signal of short pulses equivalent to this can be generated. Thus, the system of generating the light signal, which has been described with the semiconductor device shown in FIG. 2(a) as the example, will be called "induced emission modulation scheme or system" for convenience.

In the semiconductor device shown in FIG. 2(b) on the other hand, the wavelength reflected by the diffraction grating 112 formed between the second and third semiconductor layers 104 and 105 is modulated while the refractive index of the second semiconductor layer 104 is being changed. The semiconductor device is identical in operational function even to a structure shown in FIG. 4 wherein an induced emission condition control portion 152 and a light emitting portion 151 are separated from each other, and the latter is used as a light emitting diode of a surface emission type (having a form for emitting light in a laminating direction of a semiconductor layer). The light emitting diode shown on the right side of FIG. 4 is constructed by laminating on one another, a reflecting mirror layer 161 formed by alternately stacking n type semiconductor layers different in refractive index over an n type semiconductor substrate 101, an n type first semiconductor layer 162, an active layer (active region) 163 composed of a semiconductor material, which is smaller in forbidden band width than the first semiconductor layer, a p type second semiconductor layer 164 larger than the active layer in forbidden band width, and a third semiconductor layer 165 smaller in forbidden band width than the second semiconductor layer or higher in contained impurity density than that. An opening for allowing light spontaneously emitted from the active layer 163 to pass therethrough is provided in the center of an electrode layer 107 ohmic-junctioned with the third semiconductor layer.

In either of the structures shown in FIG. 2(b) and FIG. 4, the light spontaneously emitted from each of the active regions 103 and 163 of the light emitting portions 151 is wave-guided to the active region 103 in the induced emission condition control portion 152. However, part of the light is wave-guided to the first and second semiconductor layers 102 and 104 joined to the active region so as to leak thereto. Therefore, an effective refractive index $n_{eff}$ at the induced emission condition control portion 152 is not univocally determined at a refractive index $n_1$ and is affected by refractive indexes $n_3$ and $n_2$ of the first and second semiconductor layers 102 and 104. As is apparent from this, the reflected wavelength λ determined by the equation 5 changes according to the presence or absence of the application of the electric field where a refractive index change region extending along the diffraction grating 112 is formed in at least part of the second semiconductor layer 104 by the application of the electric field. The diffraction grating 112 of the induced emission condition controller 152 serves as a Blagg reflecting mirror, sends light of wavelength λ satisfying the condition expressed in the equation 5 to the light emitting portion 151 as excitation light, and urges the active regions 103 and 163 to inductively emit laser light of wavelength λ. The light of wavelength λ transmitted through the light emitting portion is returned to the light emitting portion again by the reflection of the dielectric film 153 or the reflecting mirror layer 161, where the laser light of wavelength λ is inductively emitted. Namely, the semiconductor devices disclosed in FIG. 2(b) and FIG. 4 respectively have the crossed or combined function of the Fabry-P³rot type resonator and distributed Blagg reflection type resonator. When an optical communication apparatus is constructed of this device, the wavelength of a light signal is set to either a reflected wavelength at the application of the electric field or a reflected wavelength at the non-application thereof, and light having a desired wavelength is intermittently emitted according to transmission information by the application of the electric field to the induced emission condition controller 152. The response of the induced emission to the application of the electric field to each of the induced emission condition control portions 152 in these light signal transmitter configurations is identical to that in the semiconductor device shown in FIG. 2(a). Thus, the system for generating the light signal, which has been described by taking each of the semiconductor devices shown in FIG. 2(b) and FIG. 4 as an example, will be called "wavelength modulation scheme or system" for convenience.

Examples of distributed Blagg reflecting mirror (DBR) type optical elements or devices wherein induced emission condition control portions 152 are respectively separated from light emitting portions as in the example shown in FIG. 4, are shown in FIG. 5. Of semiconductor layers constituting these, ones common in specification to the semiconductor device shown in FIG. 2 are respectively identified by the same reference numerals. Further, each layer 113 corresponding to an active region is changed in reference numeral as a wave-guiding layer to define that this layer has only a light wave-guiding function and is not related to light emission. While the optical device shown in FIG. 5(a) corresponds to the configuration of the induced emission control controller 152 shown in FIG. 2(a), a quantum well structure 114 is formed between second and third semiconductor layers 104 and 105. Further, the optical device shown in FIG. 5(b) corresponds to the configuration of the induced emission condition control portion 152 shown in FIG. 2(b). However, semiconductor regions 115 different in refractive index from a second semiconductor layer are embedded in the second semiconductor layer so as to be spaced away from each other in a propagating direction of a light signal, thereby forming a diffraction grating. Incidentally, the semiconductor regions 115 extend in bar form so as to intersect the propagating direction of the light signal, i.e., take the direction orthogonal to the sheet.

An example in which a signal light generating unit 15 is constructed by an optical fiber constructed inclusive of an optical active material, is shown in FIG. 1(b) as one example of a light signal transmitter utilizing these optical devices (DBR type optical devices). The optical fiber is constructed so as to cover the periphery of a core layer with a cladding layer lower in refractive index than it (this is called "bare fiber"). Further, the optical fiber is constructed so as to cover the periphery of the cladding layer with a covering material according to a use environment. The optical fiber may be composed of quartz as a principal component, or composed of a polymethyl methacrylate (PMMA) resin, for example. However, the former is used as a signal transmission line for optical communications. A small quantity of additives are suitably introduced in the former to control or adjust the refractive indexes of the core layer and the cladding layer. As materials for increasing the refractive index, $P_2O_5$, $GeO_2$, $Al_2O_3$ and $TiO_2$ are used, and as materials for decreasing the refractive index, $B_2O_3$ and F are used, respectively. The optical fiber used as the signal light generating unit 15 shown in FIG. 1(b) is constructed so as to contain an active material such as Er or the like in the core layer. The optical fiber has the property of causing induced emission therewithin when the inside thereof is irradiated with excitation light. When light spontaneously emitted from a light emitting diode 13 is launched into the optical fiber, the active medium provided within the optical fiber is slightly excited but do not produce induced emission. However, an optical device or element 14 shown in FIG. 5 is placed in a stage subsequent to the optical fiber. Further, an electric field is applied to the optical element shown in FIG. 5(a), and an electric field is applied or non-applied to the optical element shown in FIG. 5(b) according to the reflected wavelength of the diffraction grating, whereby the optical element 14 is caused to reflect light of signal wavelength toward the optical fiber. Since, for example, lights having coincident phases of ones weaker in the intensity of the reflected light than the semiconductor devices shown in FIG. 2 can be supplied to the optical fiber, the induced emission of laser light of signal wavelength by the corresponding optical fiber is produced, whereby signal light can be emitted. As is seen from this example, various configurations can be implemented by combinations of the light signal transmitters using the optical devices shown in FIG. 5 with other optical devices.

When an optical communication apparatus (transmitting terminal) or an optical communication system is now constructed by the light signal transmitters of wavelength modulation schemes illustrated in FIG. 2(b), FIG. 4 and FIG. 5(b) by way of example, it is desirable that laser light of wavelength, which does not contribute to information transmission, is set so as not to reach a transmission line (optical fiber). It is therefore recommended that a band pass filter 4 like the Fabry-p³rot etalon is provided between a light signal transmitter 1 constructed inclusive of such a semiconductor device and a transmission line as shown in FIG. 6(a). FIG. 6(b) is a diagram showing one example of the Fabry-p³rot etalon (this will be described in details later).

The functions for the light signal transmission according to the present invention have been described above. However, if the features of the present invention are summarized in association with the above-described first to third inventions adapted to the objects of the present invention, then they are as follows:

An optical communication apparatus according to the present invention comprises means for generating light signals according to induced emission, and light intensity attenuating means optically coupled to the light signal generating means. The light intensity attenuating means is optically coupled to a light signal transmission line. The light signal generating means has a light emitting portion for generating light according to the injection of a current therein, an induced emission unit for inductively emitting each light signal, and an excitation light generating unit for producing the induced emission. The excitation light generating unit supplies light (excitation light) of a specific wavelength component, which is included in the light produced in the light emitting portion according to the application of an electric field corresponding to transmission information, to the induced emission region. This construction is particularly suitable for an optical communication apparatus using the induced emission modulation scheme in that light of a noise component produced by spontaneous emission (light-emission mechanisms characterized by the above-described equations 6 to 10) based on the injection of a current into the light emitting portion is attenuated by the light intensity attenuating means and desired signal light (laser light) is selectively extracted. The light emitting portion, the induced emission unit and the excitation light generating unit included in the light signal generating means are not limited to their layouts if they fall within the range satisfying the above-described functions because there is an example in which they are built in the same semiconductor device as shown in FIG. 2(a) or an example in which they are separated from each other as shown in FIG. 1(b).

The light signal generating means according to the present invention does not supply a current greater than or equal to a laser oscillation threshold to the induced emission unit and sets one wavelength component of light produced by spontaneous emission as a trigger (excitation light) for induced emission. Therefore, even if the excitation light is supplied by an electrical signal at a high speed up to 100 GHz for inputting transmission information, the induced emission for generating the light signal is followed up as described above. This action is very useful from the viewpoint of the first invention for implementing the speeding up for light transmission and an increase in the capacity for the light transmission by a single wavelength. The merit or response of the follow-up or followability of the induced emission for the light signal to the electrical signal (transmission information) is useful for the purpose of assuredly providing mutual synchronization between light signal generating means provided every wavelengths in terms of the second invention for implementing the speeding up of light transmission and an increase in the capacity for the light transmission. Further, the non-execution of the induced emission by carrier injection is useful for the third invention in terms of the fact that it restrains an increase in the temperature of the light signal generating means and restricts a variation in wavelength to the minimum.

Another optical communication apparatus according to the present invention comprises means for generating light signals according to induced emission, and wavelength selecting means (band pass filter) optically coupled to the light signal generating means. The wavelength selecting means is optically coupled to a light signal transmission line. The light signal generating means has a light emitting portion for generating light according to the injection of a current therein, an induced emission unit for inductively emitting each light signal, and an excitation light generating unit for producing the induced emission. The excitation light generating unit supplies light (excitation light) of a specific wavelength component, which is included in the light produced in the light emitting portion according to the application of an electric field corresponding to transmission information, to the induced emission region. This construction is particularly suitable for an optical communication apparatus using the above-described wavelength modulation scheme (this ground is referred to the description related to FIG. 6). However, if attenuation of some extent occurs in light transmitted through the wavelength selecting means, then the present construction is useful even for the induced emission modulation scheme. Incidentally, the description of the mechanism related to the generation of the light signal will be omitted because it is identical to the aforementioned optical communication apparatus.

In the two types of optical communication apparatuses described above, other optical devices may be provided between the two means and light signal transmission lines constituting them, respectively. When a WDM type optical communication apparatus is constructed, for example, a star coupler or a directional coupler for collectively launching a plurality of light signals different in wavelength into a single light signal transmission line may be provided between the light intensity attenuating means or the wavelength selecting means and the light signal transmission line.

In either of the above-described optical communication apparatuses, the intensity or direction maintains the relation between an electric field applied to the light emitting portion to inject a current into the light emitting portion and an electric field applied to the excitation light generating unit to supply excitation light to the induced emission unit owing to the structure of the light signal generating means. Even in the case of either of the induced emission modulation scheme and wavelength modulation scheme, controlling the voltage amplitude (corresponding to the difference between respective voltage values corresponding to on and off) of an electric field signal applied to the excitation light generating unit so as to be lower than a potential difference applied to the light emitting portion is generally recommended with a view toward causing the excitation light generating unit to have a reflecting function suitable for supplying a desired wavelength component of light produced from the light emitting portion to the induced emission unit. One reason for its recommendation is that even when the transmission rate is increased to 100 Gb/s, the follow-up of the excitation light generating unit to the transmission information can be ensured. This is an advantage based on the operation principle of the present invention capable of overcoming the drawback of the semiconductor optical modulator described in the background art. However, there may be a case where in the induced emission modulation scheme or system, the transmission-rate follow-up of the excitation light generating device can be ensured owing to the configurat of the light signal generating unit even if the electric field applied to the excitation light generating unit is set to greater than the electric field applied to the light emitting portion.

Both the aforementioned optical communication apparatuses can be used for short-distance optical transmission, e.g., information communication between each base station lying within the same city and users and information communications between base stations distant in a range of about several tens of km as they are in configuration. However, when the optical communication apparatus is used in light signal transmission between base stations distant over 100 km or more, for example, light signal amplifying means may be provided between the light intensity attenuating means or the wavelength selecting means and the light signal transmission line to prevent the influence of attenuation of the intensity of the light signal over the light signal transmission line.

When the present invention is viewed from the entire optical communication system constructed inclusive of a signal transmitting unit for inductively emitting a light signal according to transmission information, a light signal transmission line for transmitting the light signal, and a signal receiving unit for receiving a light signal transmitted through the light signal transmission line and thereby reproducing the transmission information, a basic feature thereof resides in a structure wherein the induced emission for the light signal is carried out by excitation light produced according to the transmission information, and the light signal is transmitted at a transmission rate of 1 Gb/s or more between the signal transmitting unit and the signal receiving unit. It is desirable that when the excitation light is intermittently produced by an electric signal corresponding to transmission information, the electric signal is supplied as a voltage pulse. It is desirable to reduce the time width (so-called pulse width) of the voltage pulse to $1 \times 10^{-9}$s (seconds) or less. The present structure is an embodiment according to the present invention, which is suitable for the implementation of the speeding up of information transmission by the optical communication system and an increase in the capacity for the information transmission with reduced power consumption.

If the advantage of the optical communication system according to the present invention is revealed from the viewpoint of the industrial applicability, then the present invention resides in that the transmission rate of the light signal per wavelength (i.e., one light signal) could be increased to 10 Gb/s or more by performing the induced emission for the light signal with a light pulse (described specifically, pulse light of having a pulse width of $1 \times 10^{-9}$s (seconds) or less) short in time width. Here, the term "light signal of one wavelength" defines an information transfer medium produced by modulating the intensity of light lying in a predetermined wavelength band if strictly spoken. Namely, one wavelength indicates a typical value of a wavelength component of light related to signal transmission and is given for convenience. It is to be noted that a wavelength component, which contributes to one (one type of) light signal is actually distributed in a given wavelength range and the limitation of the wavelength component to a specific wavelength alone is seldom. In the optical communication system according to the present invention, information communications at a transmission rate of 20 Gb/s or more at which a plurality of light signals different in wavelength have heretofore been inevitably used, particularly, transmission rates ranging from 40 Gb/s to 100 Gb/s required of the next-generation optical communication system can be carried out by one type of wavelength signal. Therefore, a high impact is obtained in terms of simplification of the system construction (reduction in the load on maintenance) and an improvement in the management of reliability. When the transmission rate at one wavelength is increased, the followability of a light receiving element or photo-diode on the signal receiving unit side must be considered. Light receiving means having a high-speed response of 10 Gb/s or more has been introduced in Japanese Patent Application Laid-Open No. Hei 5-102515, and means for detecting the waveform of a light signal of a high velocity up to 100 Gb/s has been introduced in Japanese Patent Application Laid-Open No. Hei 8-152361, respectively. It is however recommended that when an avalanche type photo-diode (APD) and a PN type or PIN type photo-diode (PD) whose responsivity are respectively the order of a few Gb/s (in which the maximum value of a transmission rate of responsible light signal falls within a range from above 1 Gb/s to less than 10 Gb/s), are used, a plurality of photo-diodes or light receiving elements are placed in parallel and light signals incident thereto respectively are suitably cut off with time differences defined therebetween. Further, a reference signal for setting the time differences may be transmitted from the signal transmission unit with a wavelength different from that of the light signal.

Even if the present invention is adopted in a system wherein information communications are performed through the use of a plurality of light signals different in wavelength as in the WDM scheme or system, mutual transmission timings can be provided with satisfactory accuracy at a transmission rate of 10 Gb/s or more per wavelength, thereby making it possible to implement a high-reliability optical communication system.

The present invention provides not only the above-described optical communication apparatuses and systems but also it proposes control circuits and light signal transmission modules suitable for them. However, their summaries will be described in detail in best modes for carrying out the invention.

BEST MODE FOR CARRYING OUT THE INVENTION

Figure 1A:
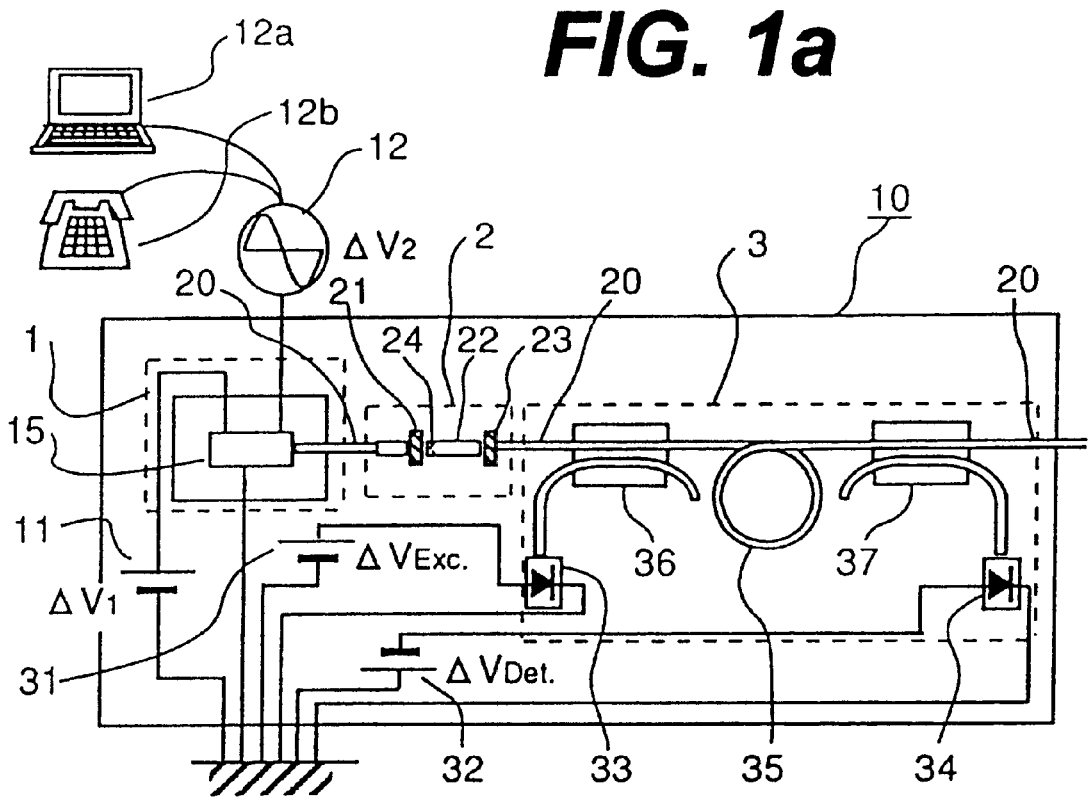
FIG. 1 is a diagram showing one embodiment of an optical communication apparatus according to the present invention.

Specific embodiments of the present invention will hereinafter be described in detail in terms of the speeding up of the transmission of in formation per one type of light signal and an increase in the capacity for the transmission of the information, and applications of the transmission of information using a plurality of optical or light signals different in wavelength from one another. In this description, the same or similar required components, which constitute the invention, are identified by like reference numerals regardless of differences between respective embodiments.

1. Improvement in the Transmission Rate per Light Signal:

In terms of the speeding up of the transmission of information per wavelength and the increase in the capacity for its transmission according to the present invention, an optical communication apparatus, an optical communication system, a control circuit suitable for use in these, and a light signal transmission module will be described in that order.

1—1. Optical Communication Apparatus:

While the summaries of the optical communication apparatuses according to the present invention have already been described in the section of the Disclosure of the Invention with reference to FIGS. 1 and 6, their details will further be explained.

An optical communication apparatus 10 shown in FIG. 1(a) has a configuration suitable for the induced emission modulation scheme or system. In the present optical communication apparatus, a light signal transmitter or transmission unit 1, a noise eliminator 2 and a light signal amplifier unit 3 are placed in series through an optical fiber 20. The optical fiber 20 extends through the light signal amplifier unit 3 and is thereafter connected to another optical fiber (not shown) corresponding to a light signal transmission line through, for example, a coupler.

Figure 1B:
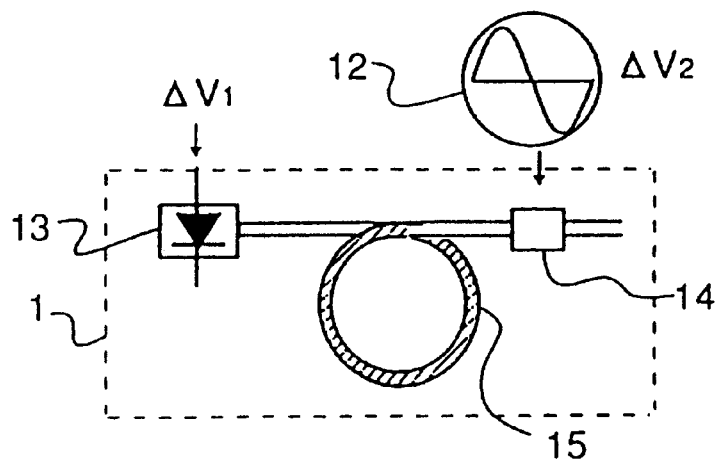
Figure 2A:
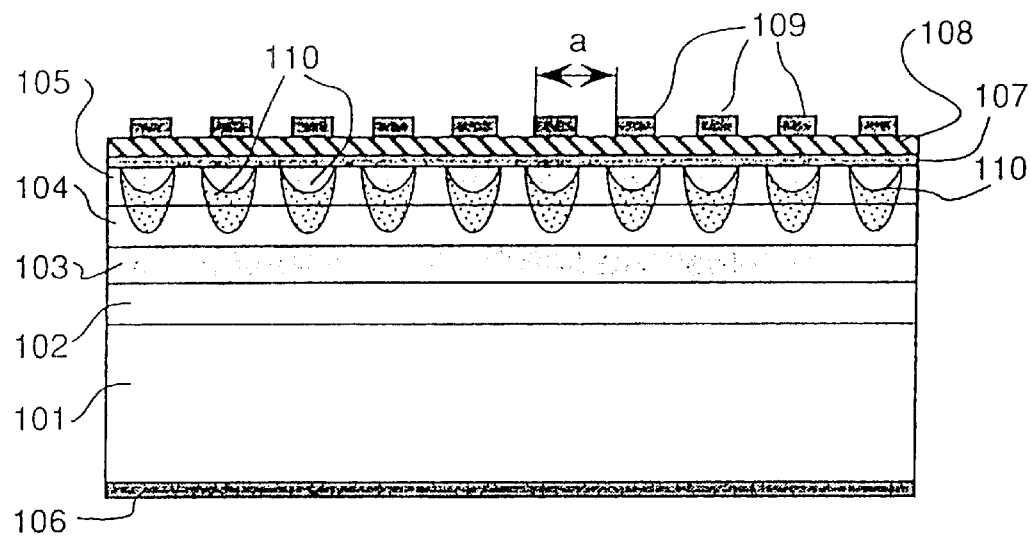
FIG. 2 is a diagram for describing a refractive index distribution of an optical wave guide layer which contributes to light-signal transmission according to the present invention.
Figure 5A:
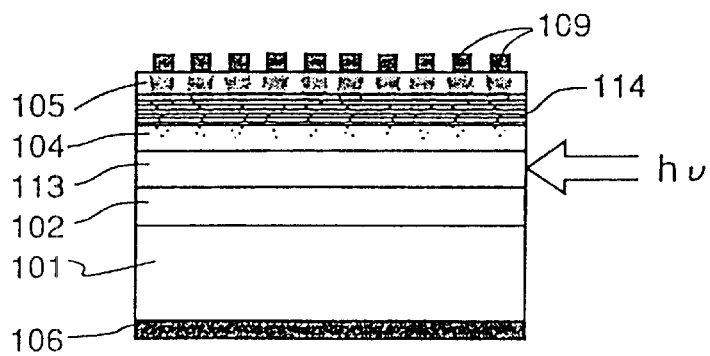
FIG. 5 is a diagram illustrating an example of a configuration of a Blagg reflecting mirror type device according to the present invention.

The light signal transmission unit 1 consists of signal light generating means shown in FIG. 1(b) and FIG. 2(a). As to the former, one having a configuration disclosed in FIG. 5(a) is adopted as an optical device or element 14. Namely, when the induced emission modulation scheme 14 is adopted, desired wavelength components (corresponding to wavelength components that one desires to use as a light signal) of light spontaneously emitted from light emitting portions 13 and 103 must be reflected according to the application of an electric signal (electric field) to excitation light generators 14 and 104 and supplied from the excitation light generators to induced emission units 15 and 103. Namely, a refractive index distribution periodical along light produced from each light emitting portion must be generated or extinguished according to an electric signal corresponding to transmission information. This is the ground that the aforementioned configuration of apparatus is required. In a periodical refractive index distribution formed in a quantum well structure 114 of an optical device or element 14 shown in FIG. 5(b) or a second semiconductor layer of a semiconductor device shown in FIG. 2(a), excitation light necessary for induced emission of a light signal is generated by reflecting a specific wavelength component of light produced with a wave guide layer 113 or an active region 103 as the center. A concept common to these apparatuses is that the application of an electric field to an optical wave guide medium or a medium adjacent thereto is performed away at predetermined intervals. The electric fields applied away are formed at such intervals a as to meet the aforementioned equation 5 with respect to a desired wavelength. If the natural number N in the aforementioned equation is set to 1 or more, it is advantageous to controllability. If the same polarities are set so as to adjoin each other in the electric fields applied away, then a refractive index change region sharply extends in a lamination direction and hence a spectrum (wavelength profile) of a reflection wavelength can be narrowed.

Described specifically, the polarities of electric signals respectively applied to electrode layers 109 are made positive or negative uniformly with respect to an electrode layer 106 corresponding to a common electrode having a ground potential. Such setting of the polarities of the applied electric fields is important to avoid crosstalk developed between light signals in an optical communication system in which information is communicated through the use of light signals of plural wavelengths to be described later.

In the semiconductor device shown in FIG. 2(a), the induced emission of the light signal can be implemented even when each refractive index change region 110 is allowed to reach the active region 103. This is because the refractive index change regions formed away in the active region 103 artificially form a Fabry-p$^3$rot type resonator together with each region substantially free of a change in refractive index, which is interposed between the refractive index change regions. This functions as an excitation light generator.

Figure 4:
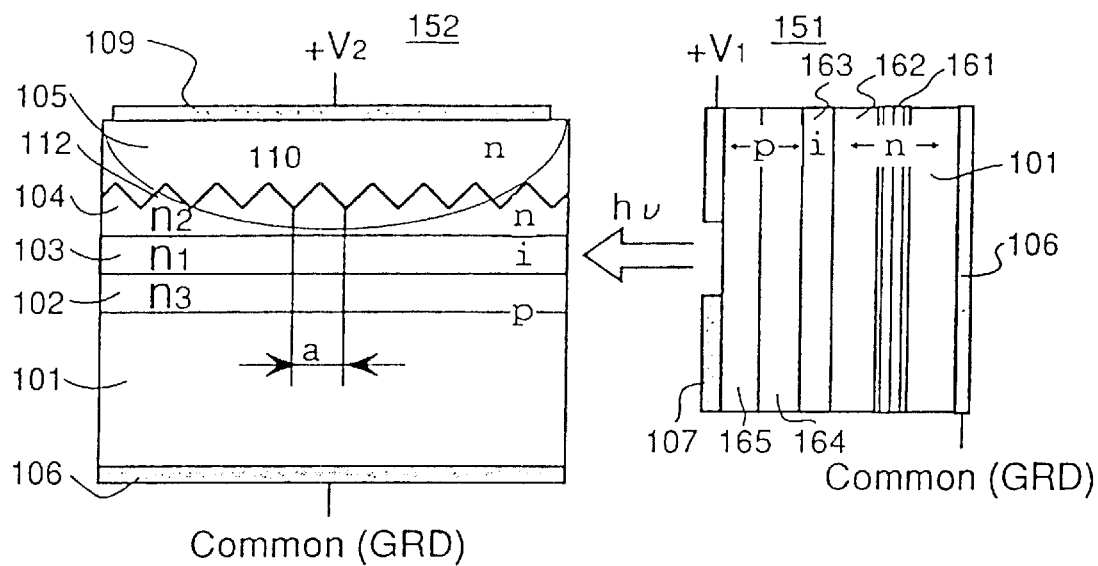
FIG. 4 is a diagram showing one form of a light signal transmission unit implemented in an optical communication apparatus of the present invention.

A light signal transmitter having a structure shown in FIG. 4 can be used in the light signal transmission unit 1. At this time, induced emission control means 152 corresponding to the excitation light generator is replaced by the configuration shown in FIG. 5(a). In the present configuration, an active layer 163 of a light emitting diode (whose details will be referred to the description in the section of the Disclosure of the Invention) used as a light emitting portion or unit 151 serves as an induced emission unit.

In the light signal transmission unit 1 described above, care should be taken so as to avoid inducing the injection of a current into a medium due to the application of the electric field for forming each refractive index change region in the medium upon constructing the excitation light generator. One of its specific measures is that at least one of the electrodes related to the application of the electric field is isolated from the medium. When a laminated structure of a semiconductor having a p-n or p-i-n junction is used as a medium, the direction of field application is so-called reversely-biased as another specific measure.

Figure 7:
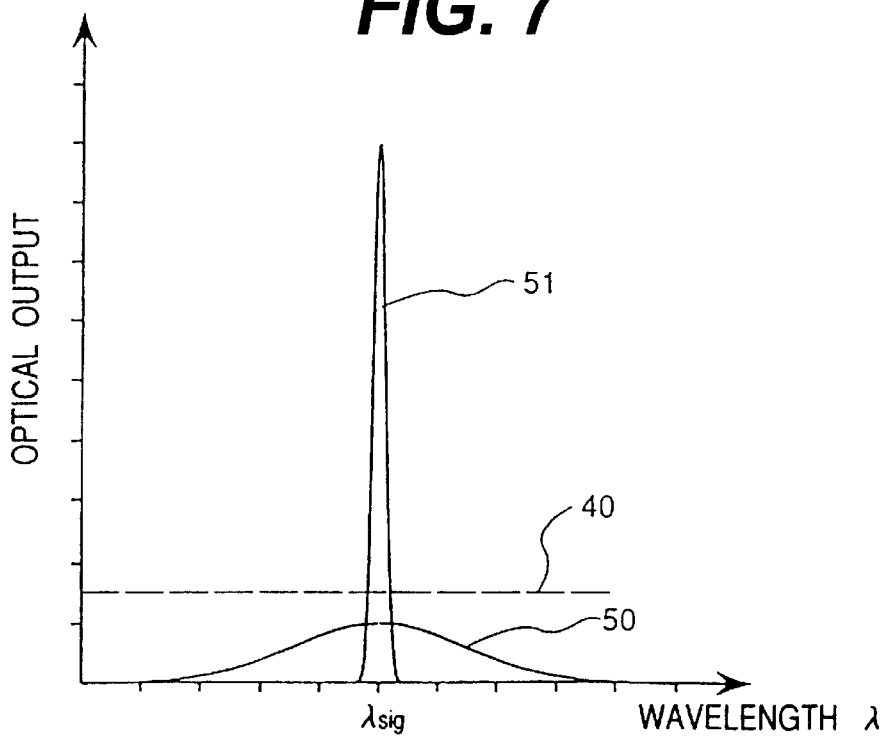
FIG. 7 is a diagram showing spectrums of light emitted from the light signal transmission unit of the optical communication apparatus according to the present invention.

On the other hand, any of lights incident to the optical fiber 20 from the light signal transmission unit 1 shows a spectrum shown in FIG. 7. A broad wavelength profile 50 developed due to spontaneous light emission at the light emitting unit and a narrow wavelength profile 51 developed due to induced light emission at the induced emission unit appear on the spectrum. Thus, the profile 50 of the spontaneously-emitted light would become noise with respect to the profile 51 of a transmission wavelength $\lambda_{sig}$ of a light signal used for the transmission of information. Since the spontaneously emitted light is low over one digit to about 2 digits as compared with the induced emitted-light in regard to input power relative to the optical fiber, measures against noise can be taken by suitably setting a level 40 for identifying a signal on the signal receiving unit side. However, a problem arises in that when the intensity of a light signal is amplified on the signal transmitting unit side to avoid attenuation of the light signal on the light signal transmission line, noise light is amplified together. Therefore, light intensity attenuating means is provided at a stage subsequent to the light signal transmission unit. The light intensity can be attenuated by inserting an optical part composed of glass or quartz onto which a metal film is evaporated, between the optical fibers. An optical isolator used to prevent the incidence of light from the light signal transmission line to the light signal transmission unit may have this function. As one example thereof, a configuration is shown in FIG. 1(a), wherein a metal film is evaporated onto an end surface of a magneto-optic rotator 22 constituting the optical isolator. The magneto-optic rotator 22 is formed of a crystal having an electrooptic effect, such as YIG, $LiNbO_3$. As an alternative to such a configuration, the metal film may be evaporated onto an end surface (or the surface (not shown) of a lens provided at the end of an optical fiber) of the optical fiber 20, which is opposite to the signal transmission line side of the optical isolator (on the light signal amplifier unit 3 side in FIG. 1). The light attenuating means provided in this way attenuates even the intensity of the light signal together with the noise light. However, when the light signal is launched into the optical fiber again after its attenuation, the intensity of the noise light would become weak negligibly as compared with the light signal due to the difference in the input power. Thus, the intensity ratio between the signal light incident on the light signal amplifier unit 3 and the noise light, so-called signal-to-noise ratio (S/N) would become extremely high in the configuration shown in FIG. 1(a).

Figure 6A:
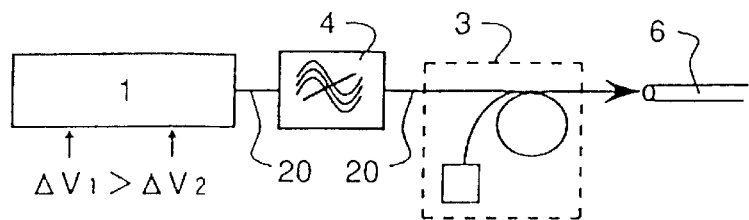
FIG. 6 is a diagram depicting one embodiment of an optical communication apparatus according to the present invention.

On the other hand, an optical communication apparatus 10 shown in FIG. 6(a) takes a configuration or structure suitable for the wavelength modulation scheme referred to above. In the present optical communication apparatus, a light signal transmitter or transmission unit 1, a wavelength selector (band pass filter) 4 and a light signal amplifier unit 3 are placed in series through an optical fiber 20. A light signal amplified by the light signal amplifier unit 3 is launched into a light signal transmission line (optical fiber) 6.

Figure 2B:
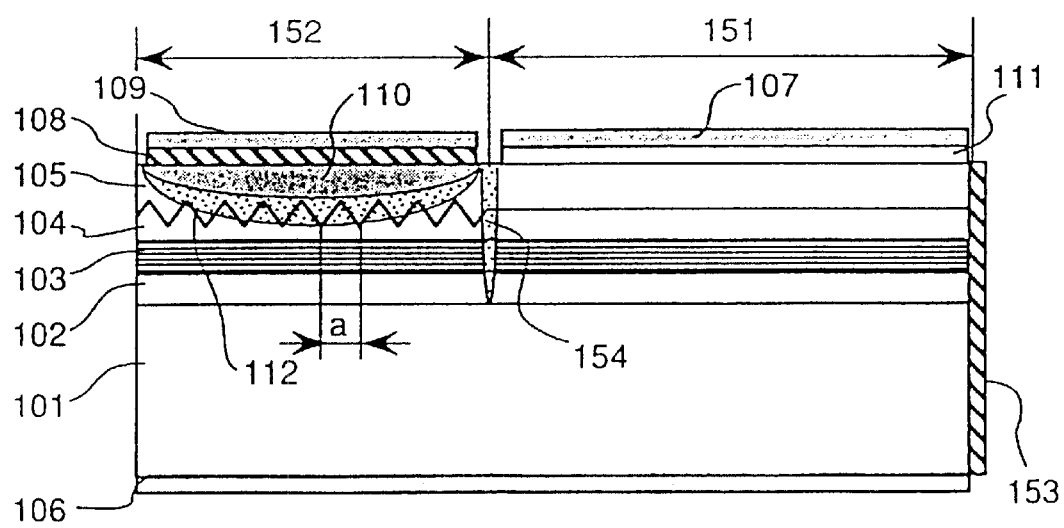
Figure 3:
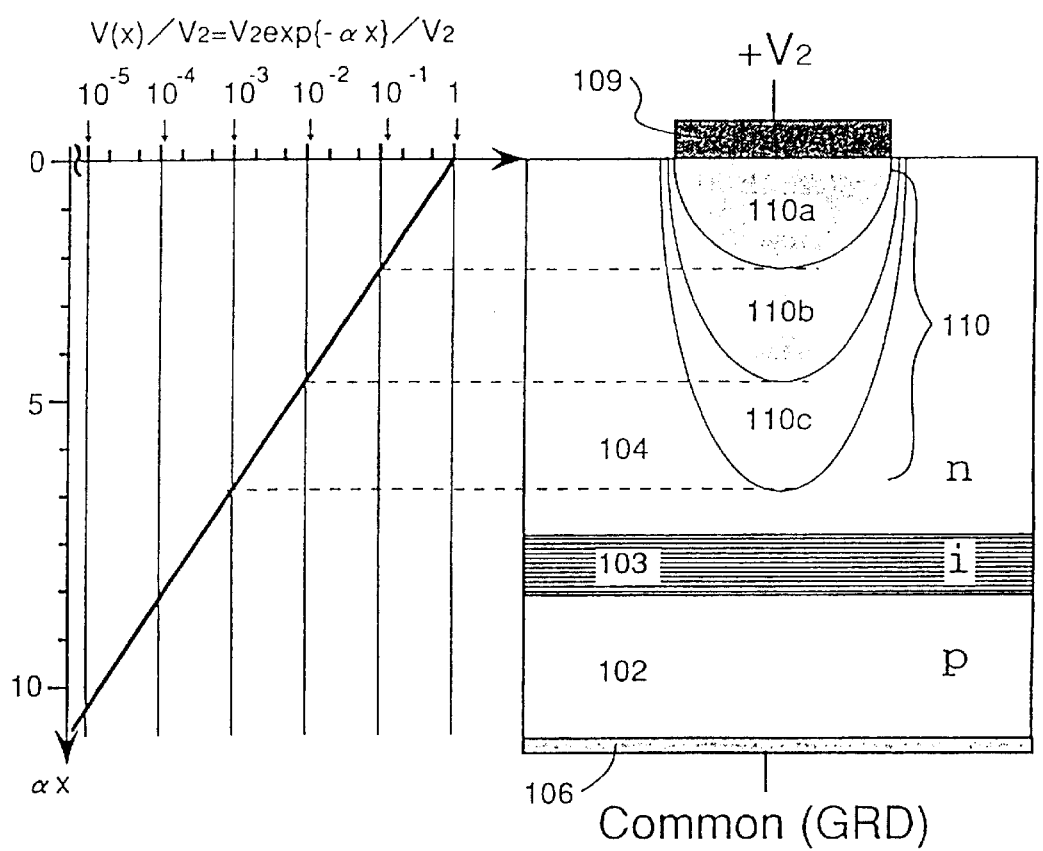
FIG. 3 is a diagram for describing the relationship between changes in refractive index and applied field strength in an optical wave guide region according to the present invention.
Figure 5B:
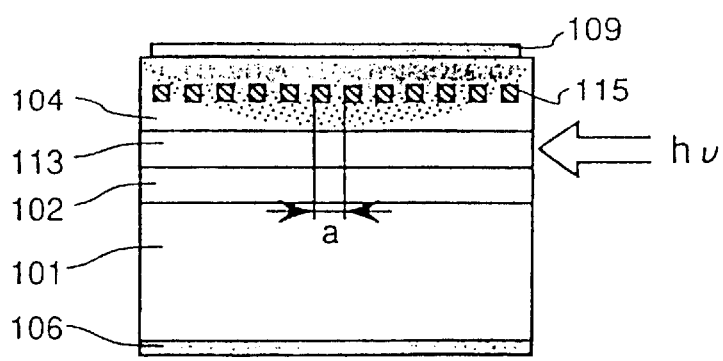

The light signal transmission unit 1 consists of signal light generating means shown in FIG. 1(b), FIG. 2(b) and FIG. 4. As to the former, one having a configuration disclosed in FIG. 5(b) is adopted as an optical element 14. Namely, in the wavelength modulation scheme, lights of wavelength λ, of lights spontaneously emitted from the light emitting units 13, 103 and 163, which meet Blagg reflection conditions set according to diffraction gratings 112 formed in the excitation light generators 14 and 104 or structures 115 based thereon, are supplied to the induced emitting units 15 and 103 to oscillate laser light of wavelength λ. It is apparent from the discussion of the aforementioned equation 5 that Blagg reflection depends on effective refractive indexes $n_{eff}$ of optical wave-guiding channels 15, 103 and 113 in the excitation light generator or the induced emission condition controller 152 provided with it. In the wavelength modulation scheme, an electric field is applied between the electrode layers 106 and 109 according to transmission information to change the refractive index of the second semiconductor layer 104, thereby changing the effective refractive index $n_{eff}$ of each optical wave-guiding channel. Thus, the wavelength of light Blagg-reflected by each of the diffraction gratings 112 and 115, i.e., excitation light for producing induced emission is varied to change the wavelength of the laser light. Namely, in the wavelength modulation scheme, the light signal is set to the wavelength of the light Blagg-reflected in the case of either the application or non-application of the electric field to each excitation light generator, whereby the transmission of the signal is performed.

Figure 6B:
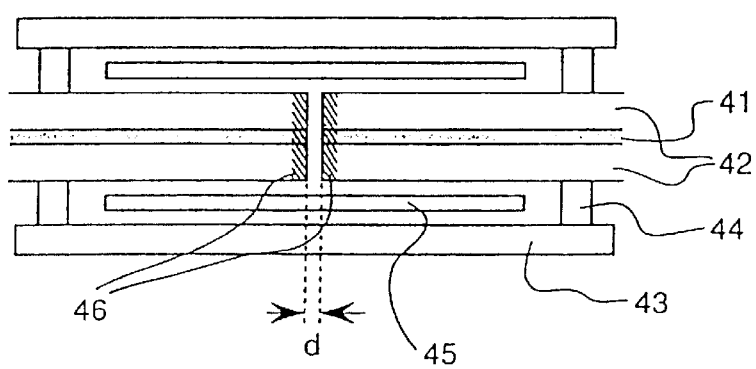

Since the transmission of the light signal according to the wavelength modulation scheme is based on the aforementioned principle of operation, the laser light different in wavelength from the light signal is transmitted to the signal receiving side through the light signal transmission line when the light signal is cut off according to the transmitted signal. Thus, the transmission information cannot be virtually recognized because laser lights different in wavelength ate continually launched into the light-receiving element, depending on the provision of wavelength selecting means, i.e., a spectroscope and a band pass filter on the signal receiving side or the non-provision of a light-receiving or detecting element or the like responsive to a specific wavelength alone. To solve such a problem, the optical communication apparatus based on the wavelength modulation scheme is provided with wavelength selecting means 4 at a stage subsequent to the light signal transmission unit 1. The wavelength selecting means 4 may make use of, for example, a spectroscope such as a diffraction grating, a prism or the like. It is however recommended that Fabry-p$^3$rot etalon is used as an optical element for ensuring the stable propagation of the light signal from the light signal transmission unit 1. FIG. 6(b) shows one example of a specific configuration of the Fabry-p$^3$rot etalon. A spectral characteristic thereof depends on a distance d at which the end surfaces of optical fibers each constructed inclusive of a core layer 41 and a cladding layer 42, and reflection characteristics of mirror portions 46 formed in the opposed respective end surfaces of the optical fibers. Each optical fiber is fixed to a piezoelectric tubing 43 composed of a piezo element with a ring-shaped spacer 44 interposed therebetween. The length of the piezoelectric tubing is changed by a voltage applied thereto to adjust the distance d between the end surfaces of the optical fibers, whereby the wavelength to be selected is set. A sleeve 25 is provided so as to avoid both core layers 41 from deviating upon adjusting the distance between the end surfaces of the optical fibers. If the end surfaces of both optical fibers can be assuredly fixed, it is then unnecessary to add the function of adjusting the distance between the end surfaces of the optical fibers. The optical element is not necessarily limited to the example of the Fabry-p$^3$rot etalon. Namely, when the light is allowed to pass through the wavelength selecting means, the light sent from the light signal transmission unit 1 is temporarily emitted from the optical fiber to thereby select light (light signal) having a desired wavelength component, followed by falling onto the next-stage optical fiber. Even in the case of the wavelength modulation scheme, the noise of the light spontaneously emitted from the light emitting unit exists in a manner similar to the induced emission modulation scheme. However, the intensity of the spontaneously emitted light that would be noise when launched into the next-stage optical fiber from the wavelength selecting means, is reduced negligibly with respect to the light signal. Therefore, even if the light intensity attenuating means employed in the induced emission modulation scheme is not provided, the noise light can be eliminated.

In the case of any of the optical communication apparatuses of the induced emission modulation scheme and the wavelength modulation scheme, the attenuation of the intensity of the light signal on the signal transmission line can be avoided by using light signal amplifying means. The outline of light signal amplifying means 3 called optical fiber amplifier is shown in FIG. 1(a). The optical fiber amplifier has the function of launching a light signal λ to be amplified into an optical fiber 35 including an active material such as Er or the like and causing induced emission of light of wavelength λ, based on the light signal to occur inside the optical fiber 35, thereby increasing the intensity of the light signal itself. It is necessary to excite the active material in the optical fiber 35 for the purpose of making it easy to produce the induced emission based on the light signal. Therefore, a laser light source 33 for supplying laser light for exciting an active medium is placed in a stage prior to the optical fiber 35, and the laser light generated from the laser light source 33 is launched into the optical fiber 35 together with the light signal through a directional coupler 36. In order to monitor whether the laser light supplied from the laser light source 33 has an intensity suitable for the excitation of the active medium, light is sampled from a directional coupler 37 provided at a stage subsequent to the optical fiber 35 and measured by a detector 34. Since the wavelength of the laser light oscillated from the laser light source 33 placed in the optical fiber amplifier is shorter than that of the signal light, the influence of interference or the like on the light signal is not produced. Since a transmission loss developed in the wavelength thereof over the signal transmission line (optical fiber) is high as compared with the light signal, no problem occurs in terms of practicality. Further, since the active material of the optical fiber 35 is always kept in an excited state, the laser light source 33 continuously performs laser oscillations. It is thus unnecessary to take into consideration the response to current injection and controlled field of the laser light source 33 in the optical communication apparatus according to the present invention.

In any of the induced emission modulation scheme and wavelength modulation scheme described above, the light brought to the source for the generation of light by the light emitting unit, i.e., the induced emission thereof is discharged spontaneously by the continuous injection of a current into the light emitting unit. Therefore, the present optical communication apparatus is low in power consumption as compared with a semiconductor laser. Further, the excitation light for generating the induced emission is instantaneously produced while following the velocity or rate of a change in refractive index at the excitation light generator. Therefore, the response to the electric signal for the induced emission of the signal light according to the present invention differs from that for the induced emission made by the current injection and is not affected by the life or the like of a carrier injected as the current. Further, the response is determined according to the time required to respond to the change in refractive index at the excitation light generator with respect to the electric signal. Since it is not necessary to greatly change the amount of the change in refractive index at the excitation light generator upon the generation of the excitation light, a problem on parasitic capacitance incident to the application of the electric signal can be ignored. Therefore, even if the pulse width of the electric signal is shortened to $10^{-11}$s (seconds) when a signal (electric field) having a voltage smaller than the applied voltage (difference in potential between the electrode layers) required to inject the current into the light emitting unit is applied to the excitation light generator in pulse form, pulsed laser light corresponding to it is obtained. The optical communication apparatus according to the present invention based on such a phenomenon has a possibility that the rate for the transmission of information through one light signal will be improved to 100 Gb/s or more.

The response to the transmission information of the optical communication apparatus according to the present invention resolves even variations in the response (delay time) due to a change in the interval between signal pulses.

Figure 8:
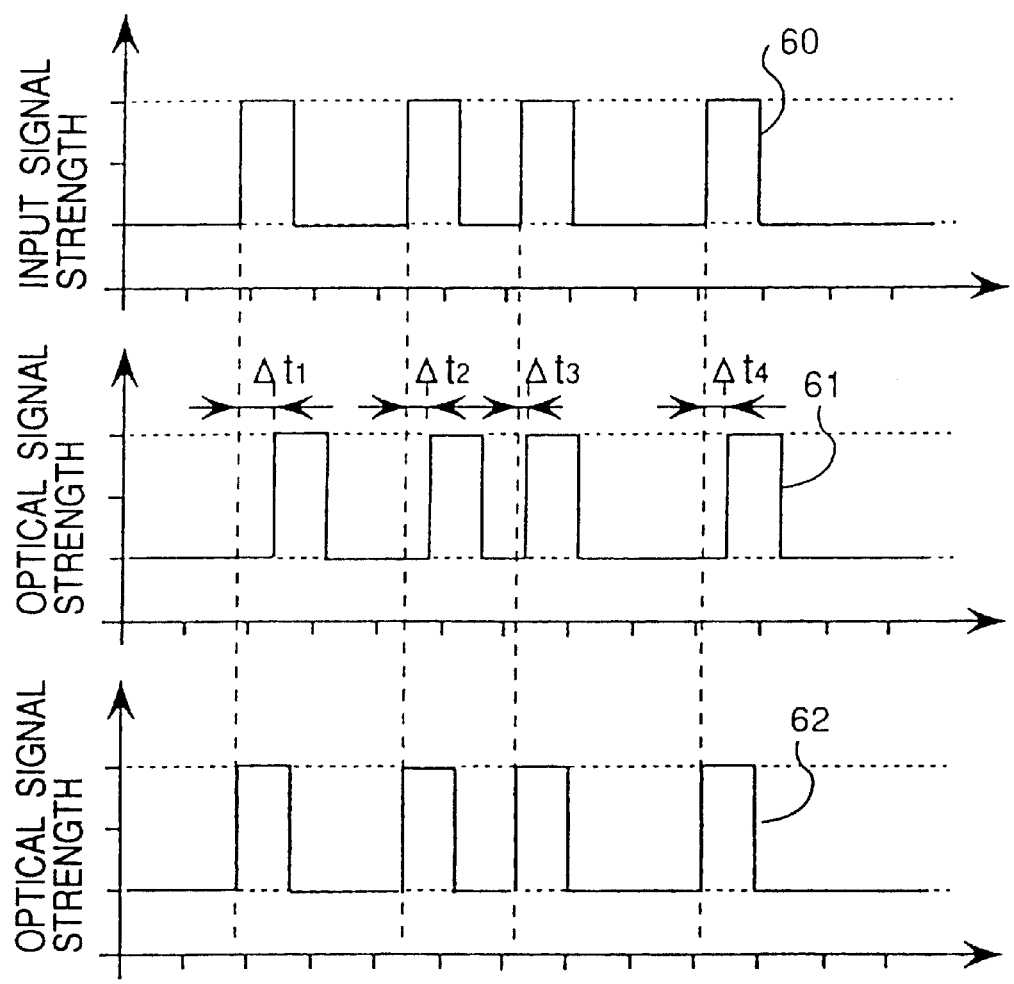
FIG. 8 is a diagram illustrating an example of a comparison of the response of each light signal intensity to the input of an electric signal between the Background Art and the present invention.

FIG. 8 typically illustrates a waveform 60 of an electric signal and a waveform of each light signal associated therewith. A delay and variations in the oscillation time as viewed in the waveform 61 of the direct modulation scheme or system as disclosed in Japanese Patent Application Laid-Open No. Hei 6-169124 are not produced in a waveform 62 obtained even in the case of any of the modulation methods according to the present invention.

Figure 9:
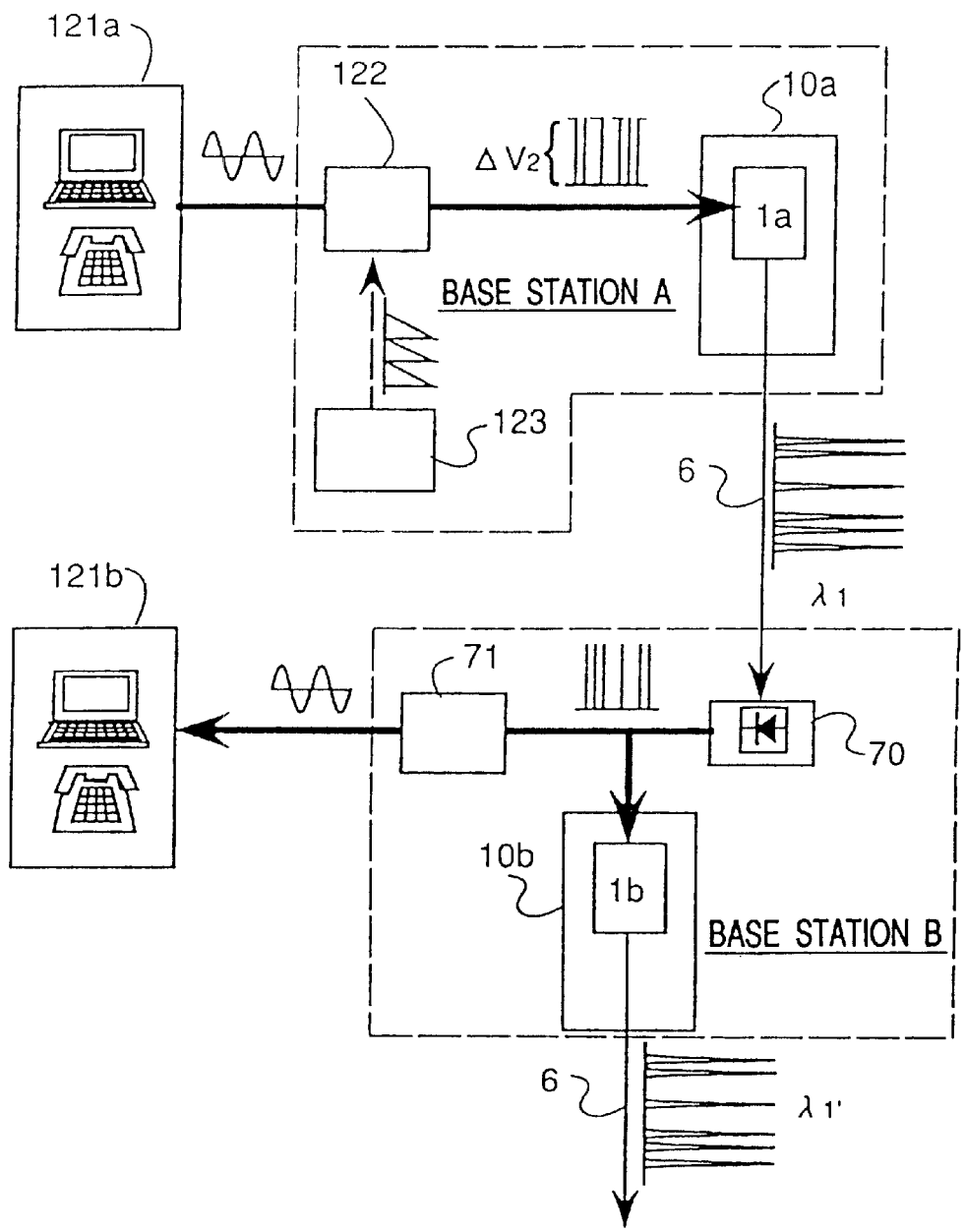
FIG. 9 is a diagram depicting one embodiment of an optical communication system according to the present invention.

1–2. Optical Communication System:

One example of an optical communication system according to the present invention will be explained with reference to FIG. 9. The present optical communication system adopts a PIM (Pulse interval Modulation) system or scheme for converting an analog signal waveform into a light signal having a pulse interval corresponding thereto and transmitting it. A summary of the optical communication system will be described while referring to changes in signal pattern shown in FIG. 10.

Figure 10A:
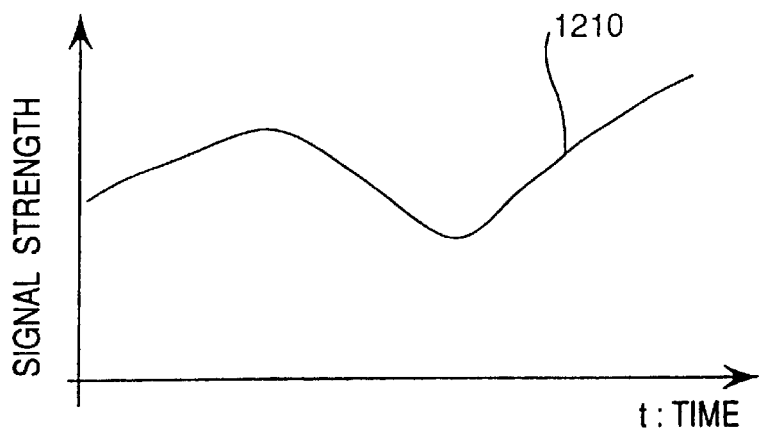
FIG. 10 is a diagram showing the situation of changes in the wavelength of a signal employed in the optical communication system according to the present invention.

An analog electric signal 1210 shown in FIG. 10(a) is now transmitted to a base station A (e.g., telephone station) from a first user 121a through a telephone, a facsimile or a computer. In the base station A, the analog signal is inputted to a comparator 122, where the waveform thereof is analyzed according to a sawtooth signal 1230 sent from a saw tooth generator 123 connected to the comparator. The comparator 122 generates a voltage pulse signal 1220 each time the intensity or strength of the sawtooth signal 1230 becomes equal to that of the analog signal 1210. The voltage pulse signal 1220 is inputted to a light signal transmitter or transmission unit 1a of an optical communication apparatus 10a, from which excitation light of wavelength $\lambda_1$ is generated for its voltage pulse. Further, a pulsed light signal 501 shown in FIG. 10(c) is inductively emitted according to the voltage pulse signal 1220. The light signal is launched into a light signal transmission line (optical fiber) 6 through the optical communication apparatus 10a and transmitted to a base station B. The base station B converts the light signal into a voltage pulse through the use of a light signal receiving unit 70. The signal of the voltage pulse converted by the base station B is restored to the analog signal by a decoder 71 provided within the base station B, followed by transmission to a second user 121b. Further, the voltage pulse converted by the base station B is inputted to an optical communication apparatus 10b provided within the base station B, depending on each destination to transmit information. Thereafter, excitation light of wavelength $\lambda_1$ is generated for each voltage pulse by a light signal transmission unit 1b provided within the optical communication apparatus 10b. The light signal inductively emitted for each voltage pulse is sent to other stations through a light signal transmission line 6. Even if the wavelength $\lambda_1$ of the light signal sent from the base station A is set to the same value as the wavelength $\lambda_1$ of the light signal sent from the base station B and is made different therefrom, no harm occurs in the implementation of the optical communication system according to the present invention.

Figure 10B:
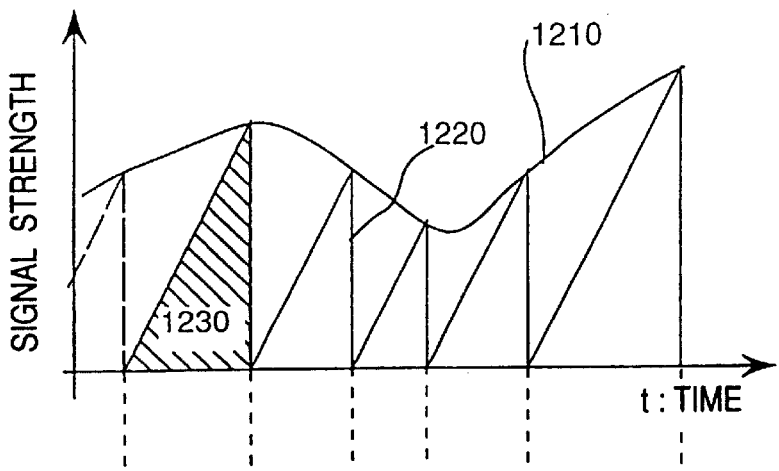
Figure 10C:
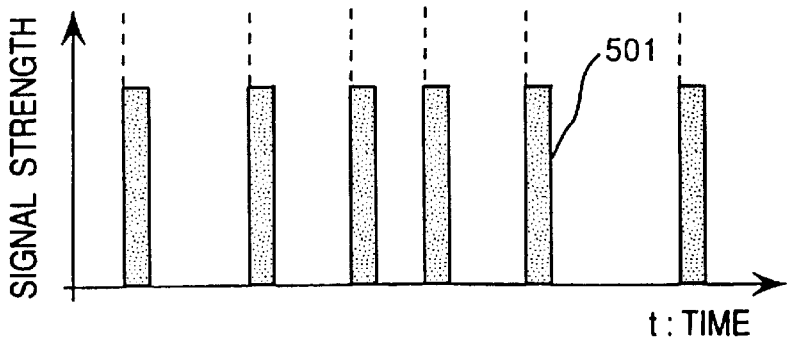

While the signal waveforms shown in FIG. 10 are typically illustrated, it is desirable to shorten the pulse width (expansion in a time-axis direction) of the light signal to $1 \times 10^{-9}$s or less for the purpose of embodying the present invention. The reason therefor is based on the principle of the light-signal induced emission of the present invention described in the section of the Disclosure of the Invention. The narrowing of the optical pulse width in this way appears to be excessive for transmission of a telephone's voice signal less than 1 MHz, for example. However, there is an advantage in that signals sent from a large number of users can be transmitted on a time-division basis. According to the present invention, there is a sufficient margin even if the time-division transmission of a plurality of pieces of information is applied to the transmission of an image signal of 4 MHz as well as to the transmission of the voice signal.

On the other hand, FIG. 11 shows an optical communication system of the present invention, which is suitable for use in the transmission of digital signals. The following description will be made with the transmission rate of a light signal employed in the present optical communication system as 20 Gb/s.

Information sent from a first user 121a as an electric signal is converted into a voltage pulse $S_1$ of 20 GHz by an electric signal source 120a having a coding function. Thereafter, the converted voltage pulse is sent to a light signal transmitter or transmission unit 1a of an optical communication apparatus 10. The optical communication apparatus 10 is identical in spec to that shown in FIG. 6(a) and generates a light signal in accordance with a waveform modulation scheme or system. Signal light of wavelength $\lambda_1$ inducedly emitted according to the voltage pulse $S_1$ is amplified by an optical fiber amplifier 3 through a band pass filter 4 of Fabry-p³rot etalon type, followed by entering into a light signal transmission line 6. The light signal transmission line 6 is composed of an optical fiber of a single mode. In order to compensate for the attenuation of the light signal inside the optical fiber 6, an optical fiber amplifier 350 is provided in the course of the optical fiber. The light signal, which has reached a light signal receiving unit 70, is amplified again by an optical fiber amplifier 351 provided inside the light signal receiving unit 70, followed by transmission to each light-receiving element 701a.

When the transmission of the light signal at the rate of 20 Gb/s is performed in the present optical communication system as described above, the followability of a light-receiving element would become a problem. The response of the semiconductor light-receiving element is defined according to its cut-off frequency. However, when the wavelength of a light signal is taken as 1.55 μm, for example, the cut-off frequency of a PIN type photo-diode of an InGaAs system suitable therefor is 2 GHz. The light-receiving element is not limited to the PIN type photo-diode. As the light-receiving element of the optical communication system using this signal wavelength, there is known an avalanche type photo-diode (APD) or the like. The response thereof is improving through the years but a responsible frequency band of a practicable element remains at a few GHz.

In the optical communication system of the present invention, a plurality of light-receiving elements are placed in parallel based on such a background and a light signal is sent to them in divided form. Further, light switches are provided on their corresponding divided light signal transmission lines and time intervals required to cause light to pass therethrough by these are shifted from each other. When the cut-off frequencies of each individual light-receiving elements 701a are taken as 5 GHz, the respective light-receiving elements respond to a light signal of 1 bit (b) and thereafter do not respond to the next light signal of 1 b for $2 \times 10^{-10}$s (seconds) even if the next light signal of 1 b falls thereon. On the other hand, the light signal of 1 b reaches at intervals of $0.5 \times 10^{-10}$s in the optical communication system operated at the transmission rate of 20 Gb/s. Therefore, in the present invention, semiconductor optical modulators 72 are placed as the light switches within four light-signal transmission lines which are caused to branch off at directional couplers 9. The semiconductor optical modulators 72 are respectively opened and closed by a clock pulse generator 73 with the differences in time therebetween. On the other hand, the light signals detected in states divided into the four systems are respectively converted into electric signals by the light-receiving elements 701a, which in turn are combined into one by the decoder 71 before the decoding of transmission information.

Figure 11A:
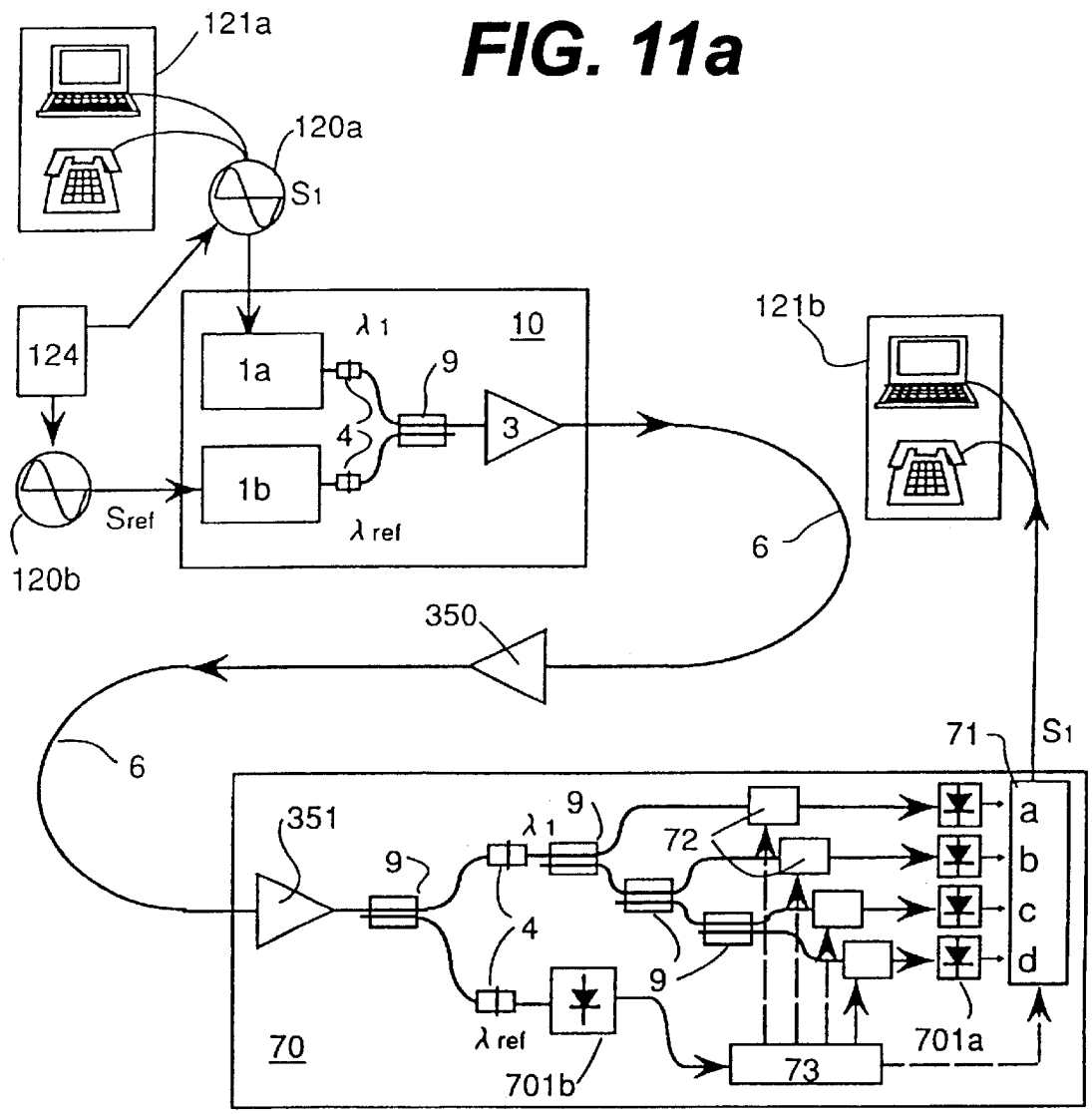
FIG. 11 is a diagram illustrating one embodiment of an optical communication system according to the present invention.
Figure 11B:
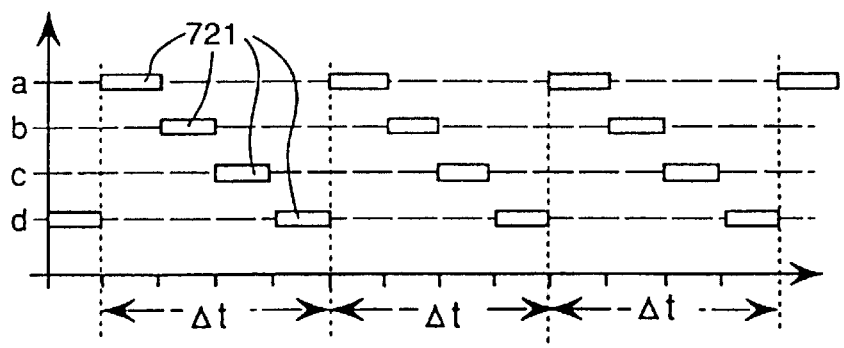

When the respective systems corresponding to the four light-receiving elements are named as a, b, c and d as shown in FIG. 11(a), patterns for opening and closing time intervals set to the semiconductor optical modulators 72 provided for these systems are illustrated as a time-chart shown in FIG. 11(b). Each of the semiconductor optical modulators 72 does not accept an electric field to be applied thereto, only for a time interval 721 and causes the light signal to pass therethrough. During time zones other than the time intervals 721, the semiconductor optical modulators 72 are supplied with the electric field to thereby absorb the light signals. The time interval (corresponding to the time during which the light signal is capable of passing through each semiconductor optical modulator) 721 during which no electric field is applied to each semiconductor optical modulator, is set to about $0.5 \times 10^{-10}$s, so that the misrecognition of transmission information due to the continuous launching of the light signal of 1 b into one light-receiving element 701a is avoided. Further, intervals Δt required to perform the opening and closing operations of the four semiconductor optical modulators are respectively set by so-called dead time determined depending on the cut-off frequencies of the light-receiving elements. The configuration of such a light signal receiving unit is intended to limit the number of optical parts to the required minimum to thereby obtain desired effects. However, the number of branches for the light signals may be increased to obtain operating margins for the light-receiving elements.

In order to match timings for the transmission and reception of each light signal with each other, a light signal transmission unit 1 for generating reference light of wavelength $\lambda_{ref}$ different from that of the light signal is provided on the transmitting side as shown in FIG. 11(a). Further, the clock pulse generator 73 may be activated with the reference light as the reference so as to control each semiconductor optical modulator 72. At this time, an electric signal source 120b for generating reference light is constructed so as to share the use of the electric signal source 120a and a clock pulse generator 124, and voltage pulses generated from the respective electric signal sources are timed. However, the time widths of the voltage pulses are both set to less than $0.5 \times 10^{-10}$s, and the intervals of the voltage pulses generated from the electric signal source 120b are thinned out so as to take a frequency below the cut-off frequency of the light-receiving element 70. Thus, it is necessary to increase the number of branches for the light signals depending on the setting of the frequency of each voltage pulse of the electric signal source 120b and change patterns for controlling the semiconductor optical modulators 72 by the clock pulse generator 73. Since it is essential to match the transmission condition up to the signal receiving unit 70 with the light signal, the reference light is combined with the light signal by the directional coupler 9 within the optical communication apparatus 10. It is desirable that the wavelength of the reference signal is close to the wavelength of the light signal. However, consideration must be given even to the fact that they are kept away from each other within a range light-separable by the band pass filter of the light signal receiving unit 70. Thus, it is desirable to set a mutual wavelength including harmonics to 10 nm or more. Incidentally, the harmonics can be also solved by the specifications of the resonator which constitutes the light signal transmission unit.

1-3. Control Circuit and Light Signal Transmission Module:

One functional characteristic of the optical communication apparatus and system according to the present invention are that an electric field is modulated in a voltage range $\Delta V_2$ smaller than a potential difference $\Delta V_1$ required to inject an operating current into a light emitting portion (to inject carriers necessary for spontaneous emission) to thereby make it possible to perform induced emission of a light signal or modulate a wavelength for induced emission. In view of the characteristics, a control source of the optical communication apparatus according to the present invention has the advantage of being capable of being shared between a light emitting portion 151 and an excitation light generator (induced emission controller) 152 as shown in FIG. 12. This advantage is brought about because the aforementioned direction of application of the electric field can be aligned with one common electrode.

Figure 12A:
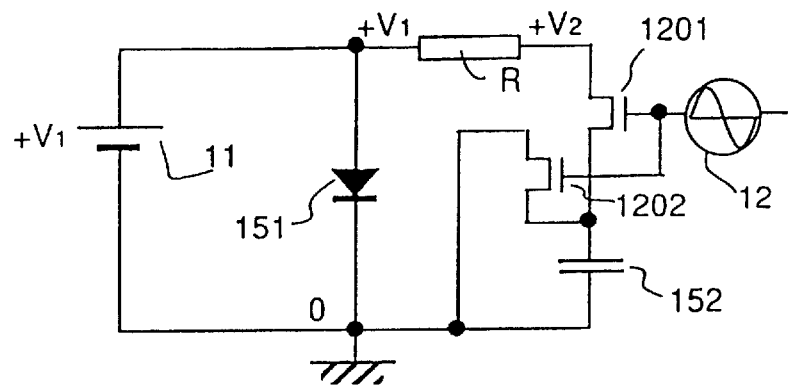
FIG. 12 is a diagram depicting one embodiment of an operation circuit of a light signal transmission unit of the optical communication system according to the present invention.

In a configuration shown in FIG. 12(a), a voltage drop of $V_2$ is developed across a resistor R, so that an electric field to be applied to the excitation light generator 152 is supplied from a driving source (current source) for applying a potential difference $V_1$ to the light emitting portion 151. Since the excitation light generator 152 is constructed so as not to inject current into a medium, it is represented as a capacitor (capacitance) in which an upper electrode and a lower electrode are opposed to each other. An electric signal supply source 12 for supplying transmission information as a pattern for each voltage pulse is connected to the gates of field effect transistors 1201 and 1202 respectively. The field effect transistor 1201 has the function of opening a channel upon application of the voltage to the gate thereof and closing it upon non-application thereof, whereas the field effect transistor 1202 has the function of closing a channel upon application of the voltage to the gate thereof and opening it upon non-application thereof. Thus, when the voltage pulse is developed from the electric signal supply source 12, $+V_2$ is applied to the upper electrode constituting the excitation light generator 152 and a voltage of 0 is applied to the lower electrode thereof, thereby causing an electric field of $+V_2$. On the other hand, when no voltage pulse is produced, the voltages applied to both the electrodes would be 0, so that the electric field developed between the electrodes disappears. Therefore, the electric field between the respective electrodes is modulated with an amplitude of $\Delta V_2$ according to the transmission information. When the voltage is applied between the electrodes, electrical charges are held on the respective electrodes. However, since a wire or interconnection extending through the field effect transistor 1202 serves so as to remove or pull the charges, it has the advantage of enhancing reliability of the transmission of a light signal at a transmission rate up to 100 Gb/s in particular by the optical communication apparatus according to the present invention.

Figure 12B:
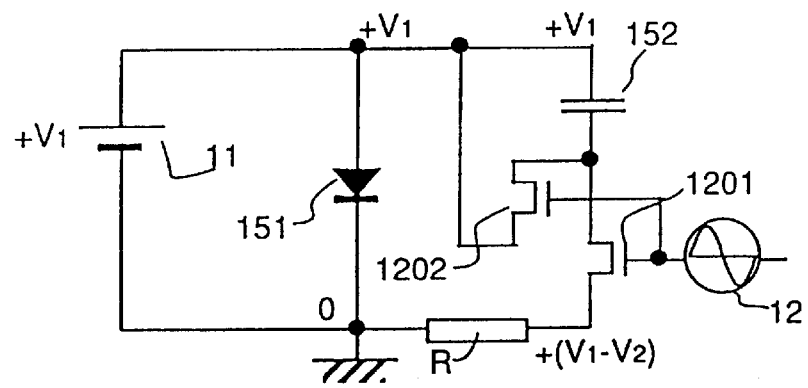
Figure 12C:
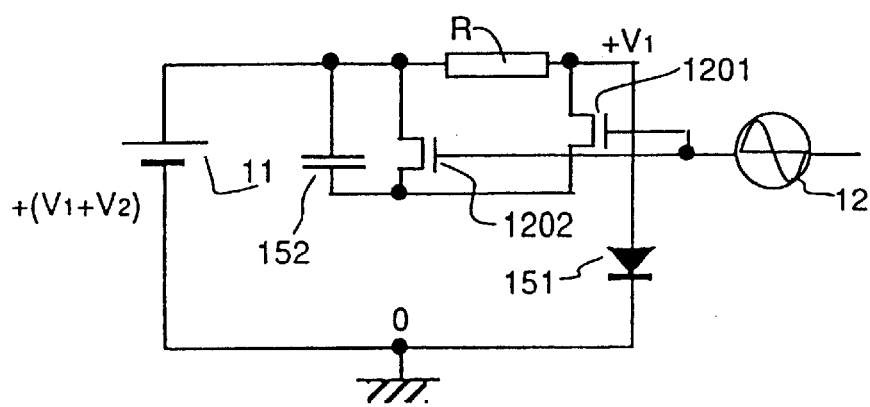

Even in the case of other examples shown in FIG. 12, electric fields in excitation light generators are respectively modulated with amplitudes of $\Delta V2$ but the absolute values of voltages applied to electrodes differ from each other. In a configuration shown in FIG. 12(b), the voltage applied to an upper electrode is fixed to $+V_1$ and the voltage applied to a lower electrode varies between $+(V_1-V_2)$ and $+V_1$. In a configuration shown in FIG. 12(c) the value of a voltage supplied from a driving source 11 is set higher than the value necessary for the light emitting portion 151, and a resistor R for developing a voltage drop thereacross is provided in series with the light emitting portion. In contrast to an upper electrode fixed to a voltage of $+(V_1+V_2)$, the voltage applied to a lower electrode varies between $+(V_1+V_2)$ and $+V_1$. The respective circuit configurations shown in FIG. 12 are suitably selected according to specifications and configurations of light signal transmission or transmitting units.

In the above-described each circuit configuration, an influence exerted on conditions for injecting a current into the light emitting portion 151 due to each voltage pulse applied to the excitation light generator 152 is not recognized when the time width of the voltage pulse is set to $1 \times 10^{-9}$s or less. The possibility of such an influence will be considered to become low as the voltage width $V_2$ modulated by the excitation light generator becomes smaller than the potential difference $V_1$ applied to the light emitting portion 151.

The light signal transmission module suitable for the present invention and a semiconductor device used therein will next be described with reference to FIG. 13.

Figure 13A:
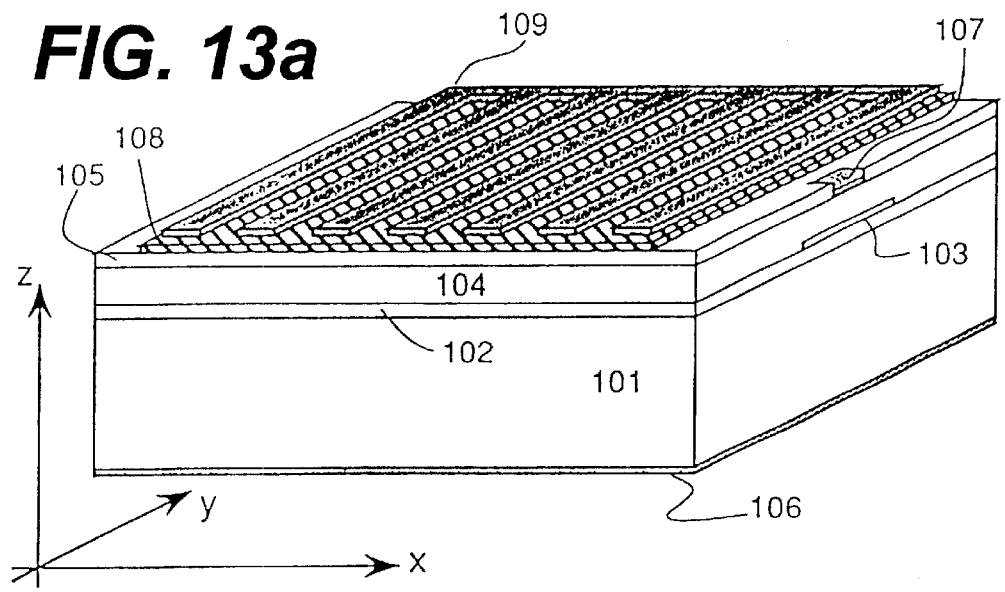
FIG. 13 is a diagram showing one example illustrative of a semiconductor device and an optical module employed in the optical communication system of the present invention.

In the optical communication apparatus and system according to the present invention, the two types of light signal generation forms corresponding to the induced emission modulation scheme and wavelength modulation scheme are provided as described above. A bird's-eye view of a semiconductor device suitable for the former, in particular, of these is shown in FIG. 13(a). The semiconductor device has a configuration based on the semiconductor device introduced in FIG. 2(a). FIG. 13(a) shows coordinates of x, y and z for the purpose of simplifying the description of the present semiconductor device subsequently. Incidentally, FIG. 2(a) is an xz cross-sectional view of a portion in which an active region 103 and an electrode layer 107 of the semiconductor device shown in FIG. 13(a) are formed.

Figure 13B:
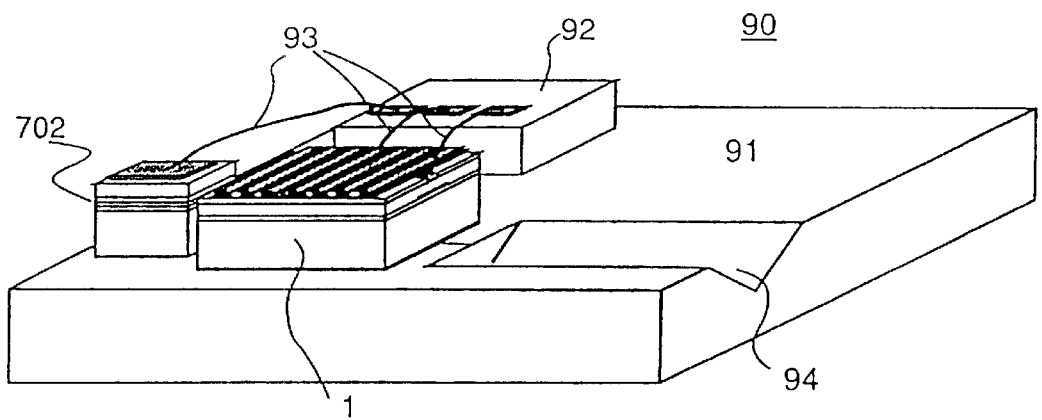
Figure 13C:
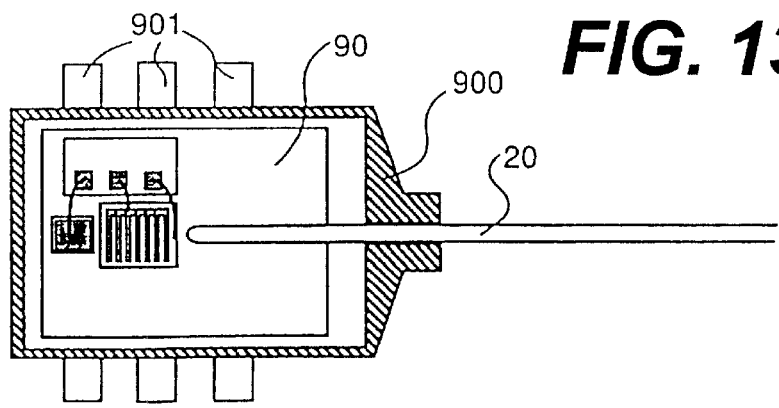

A form available to a light signal transmission unit of the present semiconductor device will first be explained with reference to FIGS. 13(b) and 13(c). In the semiconductor device, a control power circuit 92 is placed over a substrate (module substrate) 91 together with a monitoring light-receiving element 702 to thereby constitute an optical module 90 as shown in FIG. 13(b). A V-shaped groove 94 defined in a principal surface of the substrate 91 is used to fix an optical fiber. The semiconductor device is fixed onto a substrate with a position extending in a y-axis direction thereof being aligned with the groove 94 and the x-axis thereof being aligned with the extending direction of the groove 94 (the x-axis being kept in alignment therewith) in such a manner that an end surface of an optical fiber (not shown) and a laser-light emission end surface thereof are opposed to each other. The control power circuit 92 supplies a current to be injected into a light emitting portion, an electric field to be applied to an excitation light generator and an electric field to be applied to each light-receiving element therefrom through bonding wires 93. The current to be injected into the light emitting portion is supplied via the bonding wire 93 extending to an electrode layer 107, and the electric field to be applied to the excitation light generator is supplied through the bonding wire 93 extending to an electrode layer 109. The optical module 90 is further held within a package 900 composed of a resin. After the optical fiber 20 is fixed to the groove 94, the optical module 90 is packaged by putting a cover (not shown) on the package. The package 900 is provided with leads 901 for inputting external sources or voltages or signals to the control power circuit 92 on the substrate 94.

Figure 14A:
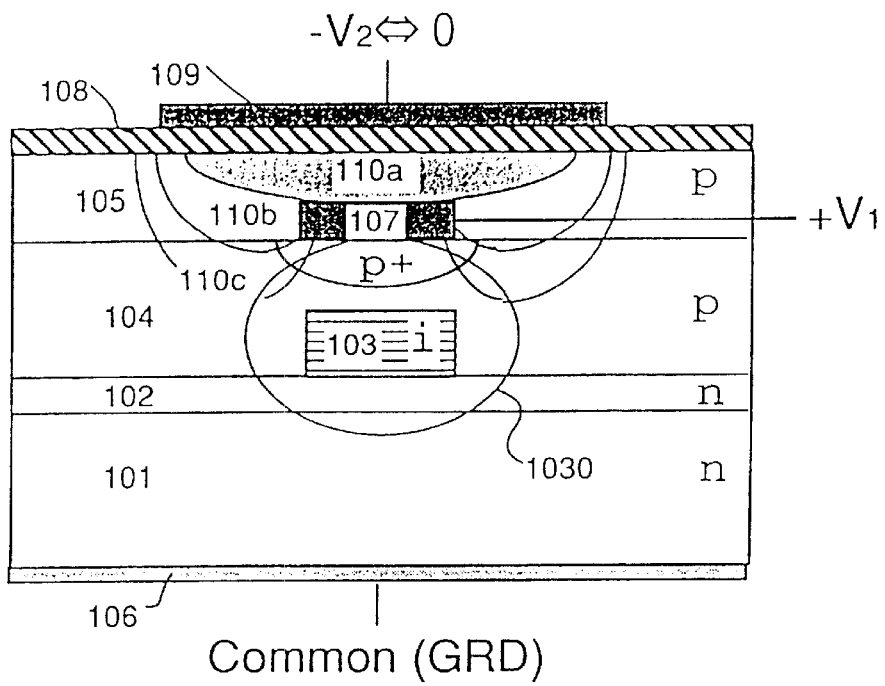
FIG. 14 is a diagram for describing the principle of operation of a light signal transmission unit according to the present invention.
Figure 14B:
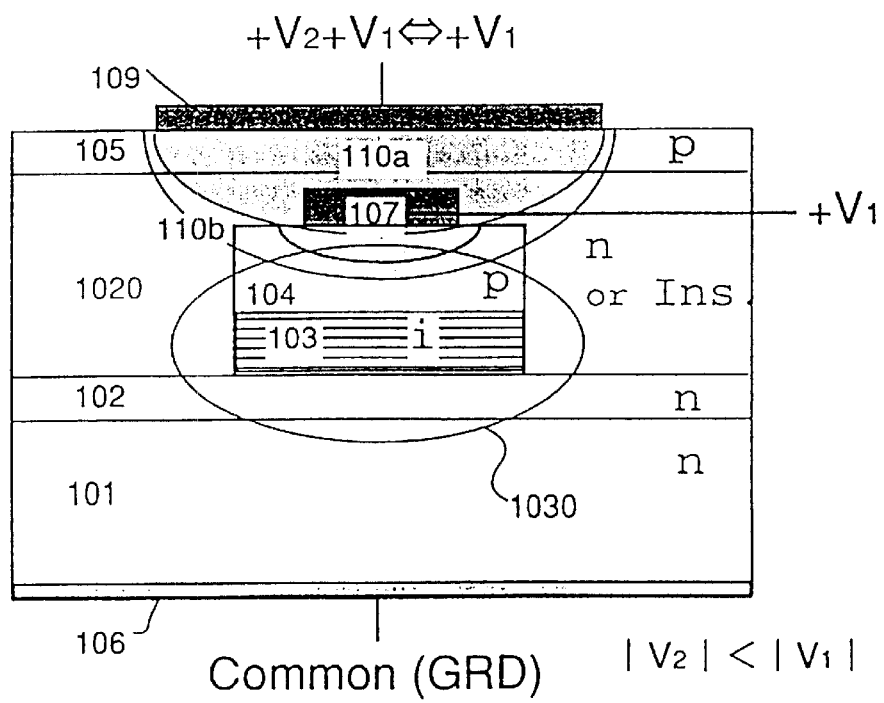

In the semiconductor device shown in FIG. 13(a), an electrode layer 109 to be formed over an upper surface thereof in a separated state is coupled to an end portion thereof. The reason why such a configuration can be adopted, resides in the relationship between a light waveguiding region employed in the semiconductor device and refractive index change regions formed by the application of an electric field from the electrode layer. This will be explained with reference to FIG. 14. In any semiconductor device shown in the drawing, a light emitting current (current which produces spontaneously emitted light) occurs between electrode layers 106 and 107, and an electric field for producing excitation light is applied between the electrode layer 106 and an electrode layer 109. FIG. 14(a) shows a yz cross-section of the semiconductor device shown in FIG. 13(a). Since laser light produced from the semiconductor device is wave-guided in an x-axis direction, it intersects this cross-section. Light spontaneously emitted in an active region 103 by the light emitting current slightly leaks to a semiconductor layer adjacent thereto in association with refractive index change regions 110a, 110b and 110c (in which the density of each pattern depends on a change in refractive index) produced by the electric field applied from the electrode layer 109. A region in which the light leaks out, extends within a circle illustrated at a reference numeral 1030 and reaches the refractive index change region 10c. Therefore, when each refractive index change region is periodically formed, the light that leaks out from the active region 103, is Blagg-reflected. Since the light leaking-out region 1030 is formed regardless of the conductivity type of the semiconductor layer, it is produced even when an n type or a semi-insulative semiconductor layer is embedded in both sides of an active layer as shown in FIG. 14(b). When the width of the active region 103, which extends in the y-axis direction, is reduced and current narrowing layers are formed over the active layer in opposing relationship, the leakage of light to the end of the yz cross section is restricted. Thus, even if electrodes spaced away from each other at a position distant to some extent from the center line of the semiconductor device, which extends along the x axis, are coupled to each other, a uniform change in refractive index due to this does not effect any influence on the Blagg reflection.

A configuration of the above-described semiconductor device and a method of manufacturing the same will next be explained specifically.

Figure 15A:
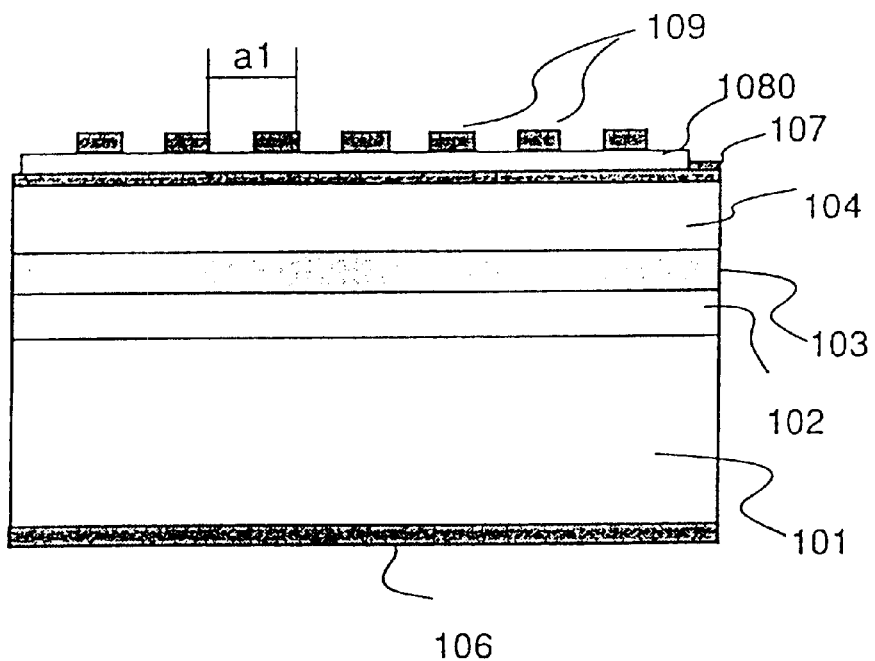
FIG. 15 is a diagram illustrating one example of a semiconductor device suitable for a light signal transmission unit of an optical communication system of the present invention.
Figure 15B:
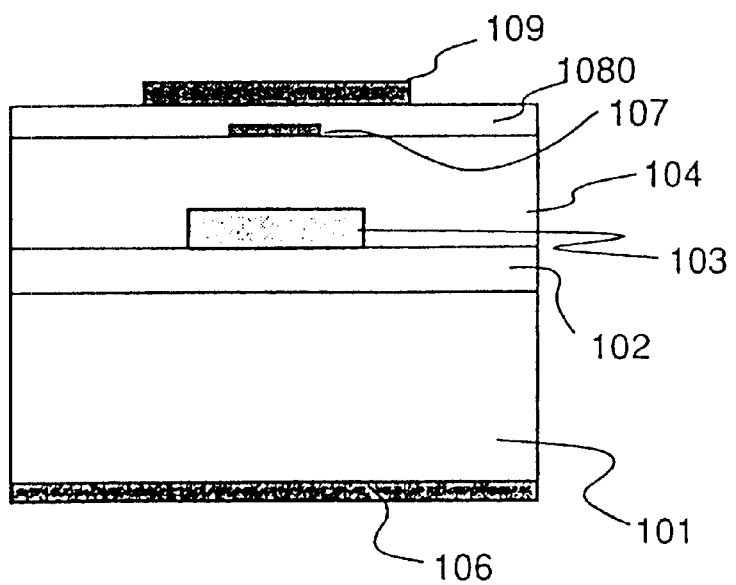

FIG. 15 shows an example of a semiconductor device constructed as a distributed feedback type InGaAsP laser. FIG. 15(a) illustrates an xz cross section of the semiconductor device, and FIG. 15(b) depicts a yz cross-section thereof, respectively. First of all, a p type InP cladding layer 102 and an InGaAsP active layer 103 are grown over a p type InP substrate 101 by a liquid phase epitaxy method (LPE method) or an organometal chemical vapor deposition method (MOCVD method). Next, the InGaAsP active layer 103 is etched in stripe form as shown in FIG. 15(b). Thereafter, an n type InP cladding layer 104 is grown thereon and a metal film for a current injecting electrode is grown over the n type InP cladding layer 104. The metal film for the current injection is formed of a material (such as AuGe/Ni/Au, AuSn/Mo/Au or the like) ohmic-junctioned with the n type cladding layer. Next, the metal film for the current injecting electrode is etched in stripe form as designated at numeral 107 in FIG. 15(b). Thereafter, an InP optical guide layer 1080 non-doped with an impurity is grown. Next, electrode metal films for field application (such as NiAl/AlAs, ScErAs or the like) 109 are grown over the surface of the InP optical guide layer. The electrode metal films 109 are Schottky-junctioned with the optical guide layer 1080. Thereafter, such one-dimensional surface gratings as to be provided at predetermined intervals al (e.g., 240 nm) in a one-dimensional direction are formed over photoresists applied onto the surfaces of the electrodes 109 by a two beam interferometric exposure method. Further, patterns for the one-dimensional surface gratings (which are named for convenience from the form of the electrode layer 109 shown in FIG. 13) may be drawn on their corresponding photoresists by electron beam exposure. After the patterns have been formed over the photoresists, field applying electrodes are etched with the resists as masks. An electrode film 106 for current injection is provided over the back of the p type InP substrate 101. A material for the electrode film 106 for the current injection is a material ohmic-junctioned with the p type InP substrate 101, which is, for example, Cr/Au, Ti/Pt/Au, Auzn/Ti/Pt/Au or the like. If a positive voltage is applied to the back electrode 106 and a negative voltage is applied to the electrode 107 to thereby inject a current into the active layer, then light is emitted in a light-emission diode mode, i.e., in the form of spontaneous emission. If a negative voltage is applied to each field applying electrode 109, then laser light having a wavelength of $2 \times al \times n_{eff}$ is radiated. However, $n_{eff}$ indicates the refractive index of an InGaAs active layer 1204. If an input electric signal 106 is converted to a voltage to be applied to the electrode layer 109 by the voltage application controller 12 shown in FIG. 1 to thereby control laser oscillations, then high-speed electricity-light signal conversion free of the occurrence of a delay time is allowed.

Figure 16A:
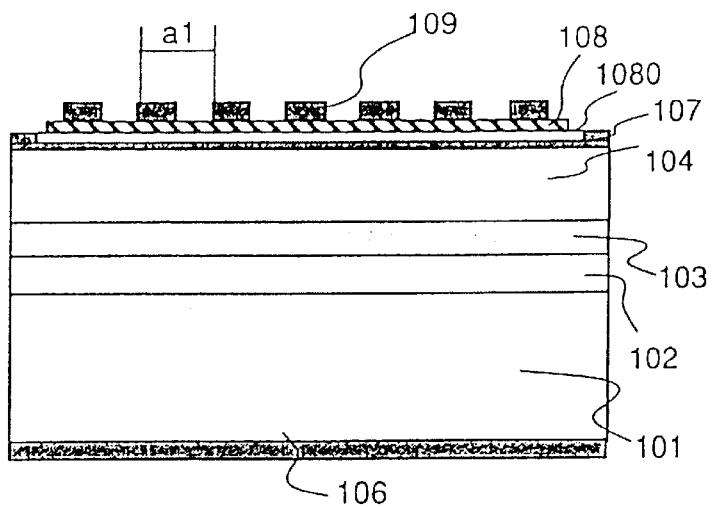
FIG. 16 is a diagram showing one example of a semiconductor device suitable for a light signal transmission unit of an optical communication system of the present invention.
Figure 16B:
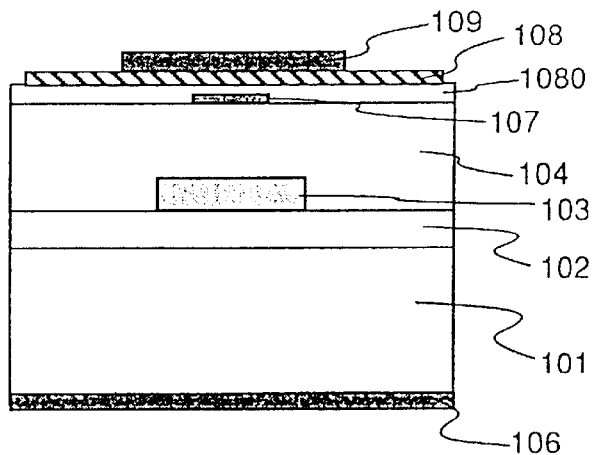

A structure using an insulating film to apply the voltage for forming a diffraction grating in the aforementioned distributed feedback type InGaAsP laser will be explained with reference to an xz cross section of FIG. 16 (a) and a yz cross section of FIG. 16(b). First of all, a p type InP cladding layer 102 and an InGaAsP active layer 103 are grown over a p type InP substrate 101 by a liquid phase epitaxy method (LPE method) or an organometal chemical vapor deposition method (MOCVD method). Next, the InGaAsP active layer is etched in stripe form as shown in FIG. 16(a), after which an n type InP cladding layer 104 is grown thereon and a metal film for a current injecting electrode is grown over the n type InP cladding layer 104. The metal film for the current injection is formed of a material (such as AuGe/Ni/Au, AuSn/Mo/Au or the like) ohmic-junctioned with the n type cladding layer. Next, the metal film for the current injecting electrode is etched in stripe form as shown in FIG. 16(a). Thereafter, an InP optical guide layer 1080 doped with no impurity is grown. Next, an insulating film 108 (such as $SiO_2$, PLZT or the like) is formed over the surface of the InP optical guide layer. Electrode metal films for field application 109 are grown. Thereafter, such one-dimensional surface gratings as to be provided at predetermined intervals al (e.g., 240 nm) in a one-dimensional direction are formed over photoresists applied onto the surfaces of the electrodes 109 by a two beam interferometric exposure method. Further, patterns for the one-dimensional surface gratings may be drawn onto their corresponding photoresists by electron beam exposure. After the patterns have been formed over the photoresists, field applying electrodes are etched with the resists as masks. An electrode film 106 for current injection is provided over the back of the p type InP substrate. As a material for the electrode film 106 for the current injection, may be mentioned, for example, Cr/Au, Ti/Pt/Au, AuZn/Ti/Pt/Au or the like ohmic-junctioned with the p type InP substrate 101. If a positive voltage is applied to the back electrode 106 and a negative voltage is applied to the electrode 107 to thereby inject a current into the active layer, then light is emitted in a light-emission diode mode. If a voltage is applied to each field applying electrode 109, then laser light having a wavelength of $2 \times al \times n_{eff}$ is radiated. However, $n_{eff}$ indicates the refractive index of the InGaAs active layer 103. If an input electric signal 106 is converted to a voltage to be applied to the electrode layer 109 by the voltage application controller 12 shown in FIG. 1(b) to thereby control laser oscillations, then high-speed electricity-light signal conversion free of the occurrence of a delay time is enabled.

Figure 16C:
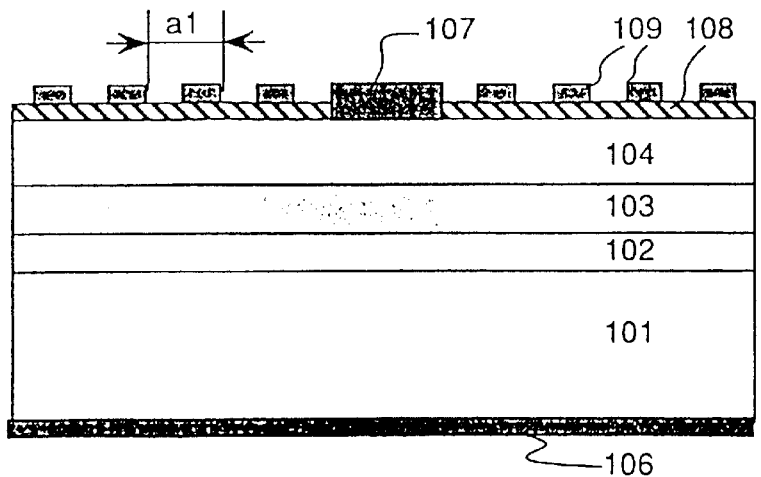

Incidentally, a structure of a distributed Blagg reflection type laser fabricated by applying the above-described process is shown in FIG. 16(c). While the laser is different in construction from the aforementioned semiconductor device, it is substantially identical in performance to the semiconductor device.

Figure 17A:
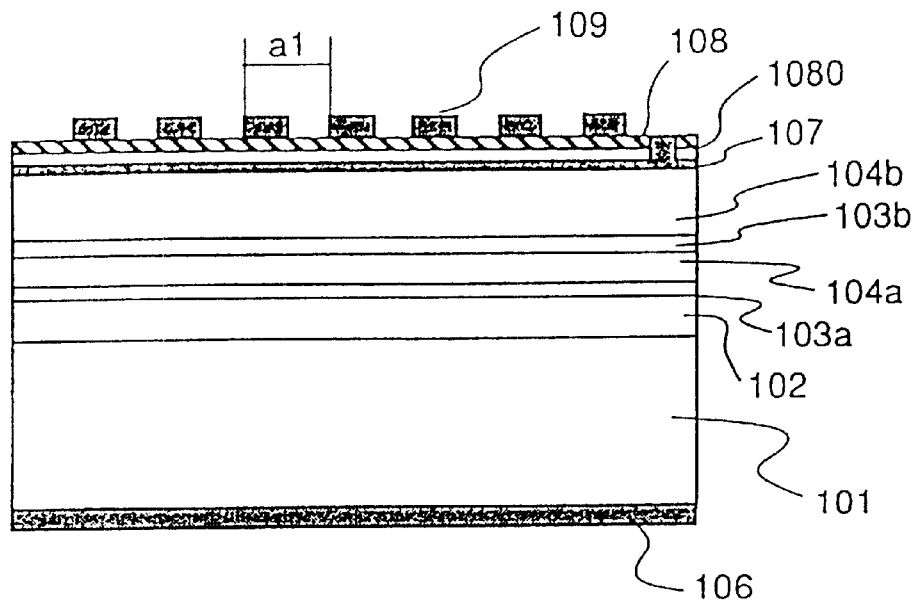
FIG. 17 is a diagram depicting one example of a semiconductor device suitable for a light signal transmission unit of an optical communication system of the present invention.
Figure 17B:
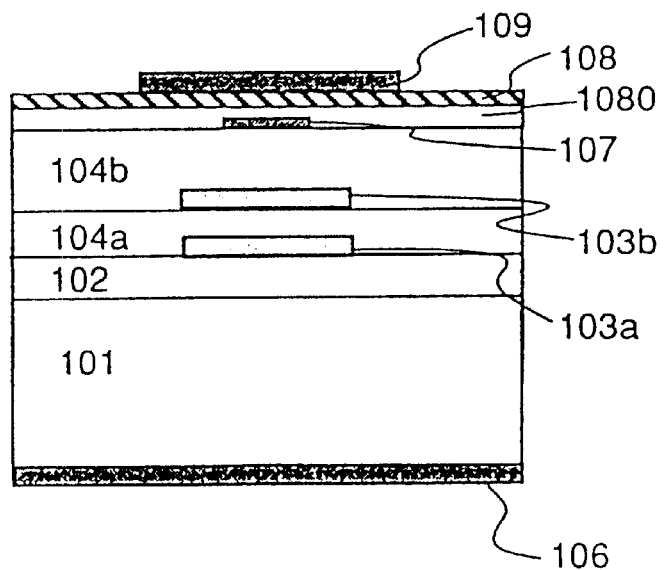

An example of a structure using a distributed feedback type InGaAsP multiple quantum well laser will further be explained with reference to an xz cross section of FIG. 17 (a) and a yz cross section of FIG. 17(b). A p type InP cladding layer 102 and an InGaAsP active layer 103a are first grown over a p type InP substrate 101 by a liquid phase epitaxy method (LPE method) or an organometal chemical vapor deposition method (MOCVD method). Next, the InGaAsP active layer is etched in stripe form as shown in FIG. 17(b), after which an n type InP cladding layer 104a is grown thereon. Further, an InGaAsP active layer 103b is grown over the n type InP cladding layer 104a. Next, the InGaAsP active layer is etched in strip form as shown in FIG. 17(b) to thereby grow an n type InP cladding layer 104b. After the stripe-shaped active layers and cladding layers are stacked on each other over two cycles or more in this way, a metal film for a current injecting electrode 107 is grown. The metal film for the current injection is formed of a material (such as AuGe/Ni/Au, AuSn/Mo/Au or the like) ohmic-junctioned with the n type cladding layer. Next, the metal film for the current injecting electrode is etched in stripe form as shown in FIG. 17(b), thereby growing an InP optical guide layer 1080 doped with no impurity. Next, an insulating film 108 (such as $SiO_2$, PLZT or the like) is formed over the surface of the InP optical guide layer. Electrode metal films for field application 109 are then grown. Thereafter, such one-dimensional surface gratings as to be provided at predetermined intervals al (e.g., 240 nm) in a one-dimensional direction are formed over photoresists applied onto the surfaces of the electrodes 109 by a two beam interferometric exposure method. Further, patterns for the one-dimensional surface gratings may be drawn onto their corresponding photoresists by electron beam exposure. After the patterns have been formed over the photoresists, field applying electrodes are etched with the resists as masks. An electrode film for current injection 106 is provided over the back of the p type InP substrate. A material for the electrode film for the current injection 106 is a material ohmic-junctioned with the p type InP substrate 101, which is, for example, Cr/Au, Ti/Pt/Au, AuZn/Ti/Pt/Au or the like. If a positive voltage is applied to the back electrode 106 and a negative voltage is applied to the electrode 107 to thereby inject a current into each active layer, then light is emitted in a light-emission diode mode (spontaneous emission). If a voltage is applied to each field applying electrode 109, then laser light having a wavelength of $2 \times a1 \times n_{eff}$ is radiated. However, $n_{eff}$ indicates the refractive index of each of the InGaAs active layers 103a and 103b. If an input electric signal is converted to a voltage to be applied to the electrode layer 109 by the voltage application controller 12 in the optical communication apparatus shown in FIG. 1 to thereby control laser oscillations, then high-speed electricity-light signal conversion free of the occurrence of a delay time is enabled.

2. Application to Information Transmission Using a Plurality of Light Signals:

Embodiments in which the present invention is applied to information transmission using a plurality of light signals different in wavelength, will be explained in order of an optical communication system and a semiconductor device suitable therefor.

Figure 18:
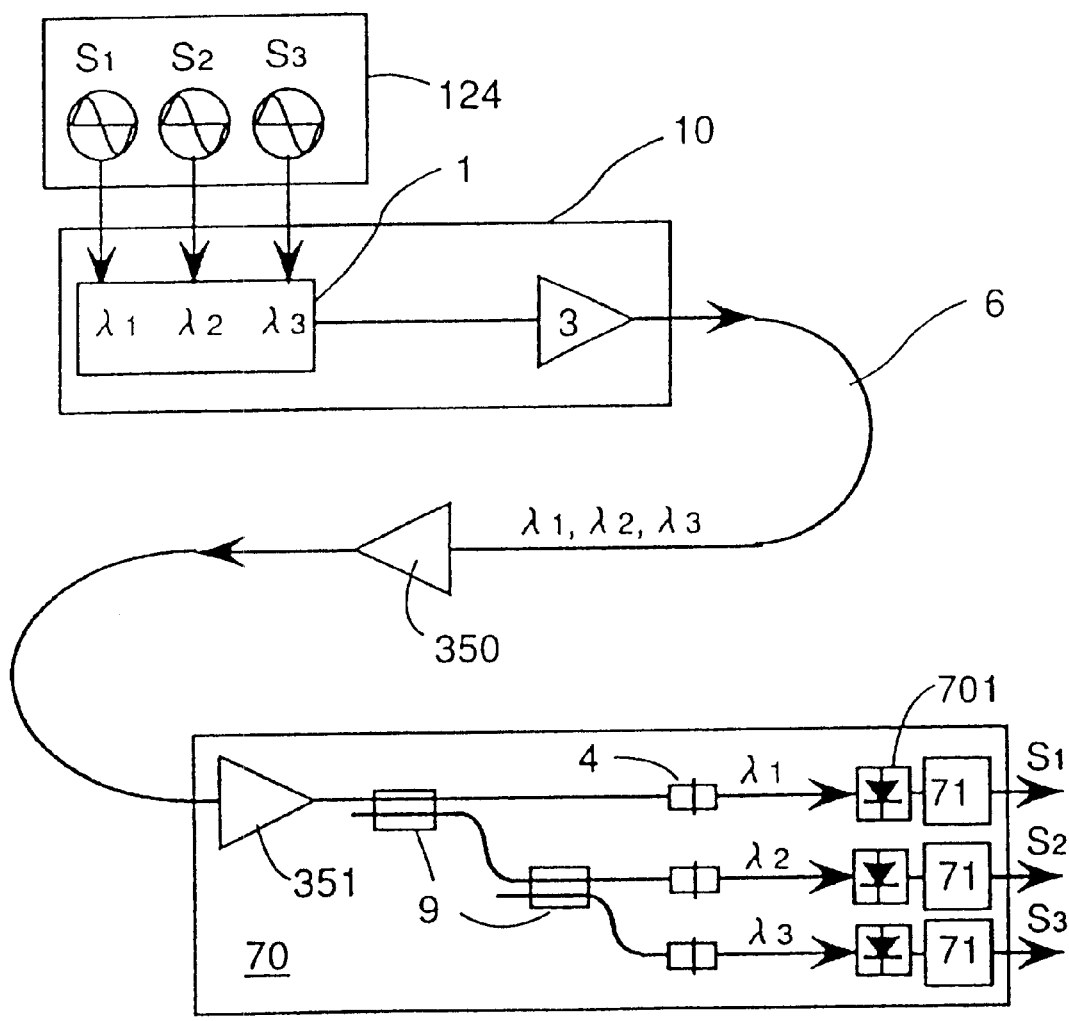
FIG. 18 is a diagram showing one embodiment of an optical communication system according to the present invention.

2–1. Optical Communication System:

FIG. 18 shows the outline of an optical communication system according to the present invention, using a plurality of light signals. A principal apparatus, which constitutes the optical communication system, is common to the system described in FIG. 11(a) but different therefrom in the specifications of a light signal transmission unit 1 and the function of a coding device 124 for supplying transmission information thereto. In the present system configuration, each light signal is transmitted at a transmission rate of 10 Gb/s per signal wavelength in accordance with the above-described induced emission modulation scheme.

Figure 19A:
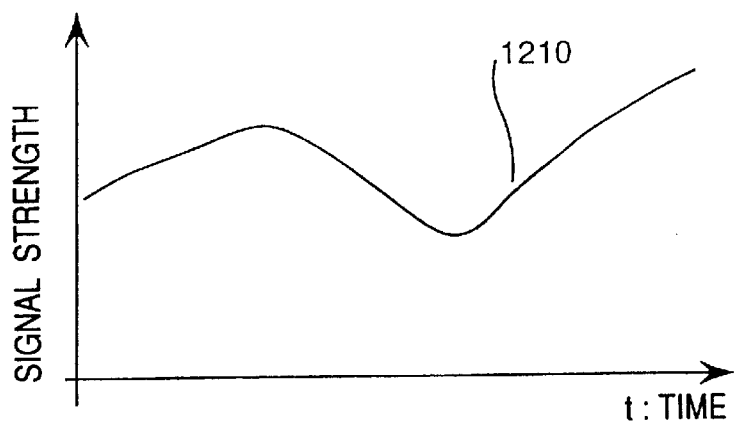
FIG. 19 is a diagram illustrating the situation of changes in the wavelength of a signal employed in the optical communication system according to the present invention.
Figure 19B:
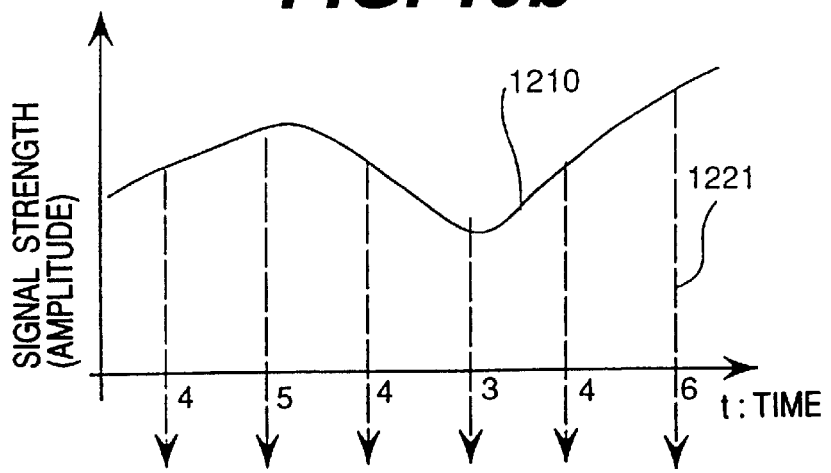
Figure 19C:
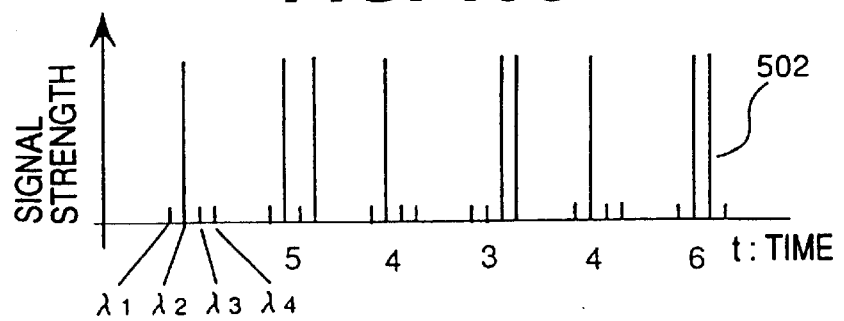

FIG. 19 shows a waveform change in a process for converting an analog signal employed in the optical communication system shown in FIG. 18 into digital form and transmitting the signal represented in digital form. FIG. 19(a) shows a waveform 1210 of an analog signal inputted to the coding device 124. While the present waveform is identical to that shown in FIG. 10, pulse signals 1221 are beaten at predetermined time intervals by the coding device 124 and the strength (amplitude) of the waveform 1210 is sampled (see FIG. 19(b)). The sampled ones are code-converted into a binary number according to the magnitudes of the amplitudes. The coding device 124 allocates bits every binary number's digits and assigns them to respective light signals of wavelengths $\lambda_1$, $\lambda_2$, $\lambda_3$ and $\lambda_4$. FIG. 19(c) shows voltage signals converted by 4-bit values. The voltage signals are inputted to excitation light generators corresponding to their wavelengths, which are provided in the light signal transmission unit 1. The present signal transmitting system has an advantage that it is complex in apparatus configuration or structure as compared with one described with reference to FIG. 10 but hard to be susceptible to the influence of noise.

In the present invention, the voltage signals shown in FIG. 19(c) are transmitted to the light signal transmission unit as voltage pulses each having a width of $1 \times 10^{-9}$s or less from the coding device 124, whereby the time intervals required to cause the light signals of wavelengths to reach the signal receiving side can be matched with one another with satisfactory accuracy. Therefore, reception errors in the light signals transmitted at the transmission rate of 10 Gb/s little occur.

2—2. Semiconductor Device:

In the optical communication system described with reference to FIG. 18, light signal transmission units may be provided every wavelengths of light signals. However, when a semiconductor device introduced below is adopted, a plurality of light signals different in wavelength from each other can be transmitted by a single light signal transmission unit. The semiconductor device basically has a structure or configuration similar to that of each of the semiconductor devices shown in FIG. 13 and FIGS. 15 through 17 but is characterized by a configuration of each electrode constituting an induced emission condition controller.

Figure 20A:
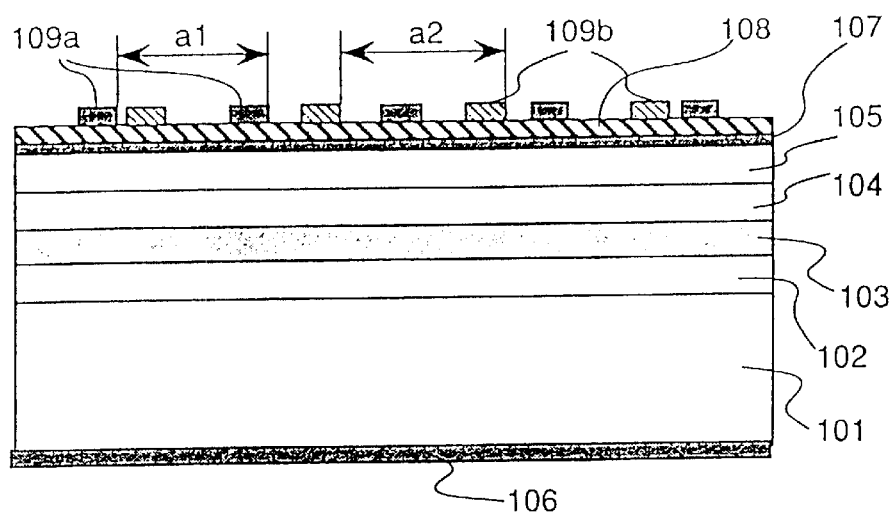
FIG. 20 is a diagram showing one example of a semiconductor device suitable for a light signal transmission unit of an optical communication system of the present invention.

FIG. 20(a) shows one example of the structure of the present semiconductor device in the form of an xz cross section. Respective semiconductor layers, which constitute the semiconductor device, are substantially identical in structure to one shown in FIG. 2(a). However, electrode layers 109 for generating excitation light are divided into 109a (interval a1) and 109b (interval a2) different in interval from each other. Thus, since two types of refractive index distributions different in cycle can be formed over an active layer, it is possible to inductively emit two types of lights of different wavelengths regardless of harmonics or the like simultaneously or independently from one semiconductor device.

Figure 20B:
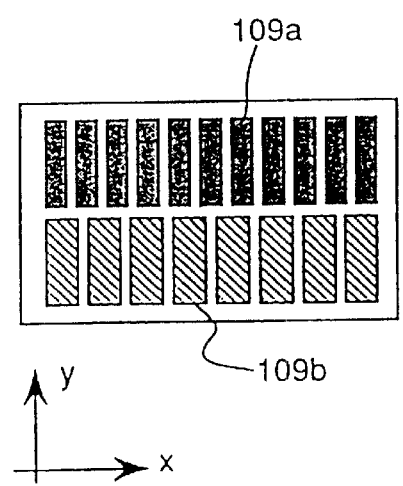
Figure 20C:
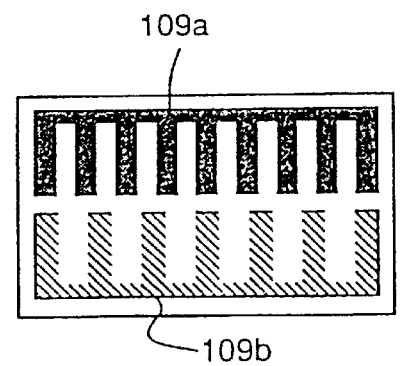

FIGS. 20(b) and 20(c) are respectively diagrams of the semiconductor device of FIG. 20(a) as viewed from thereabove and show specific forms of the electrode layers different in separation cycle from each other. A characteristic common to both electrode configurations is that side-to-side intervals between the electrode layers are different from each other as viewed from a wave-guiding direction (x-axis direction) of a light signal. However, even if the form of each refractive index change region periodically created by the application of an electric field from each electrode 109 is not symmetric with respect to a light wave-guiding region, the periodic refractive index change allows Blagg-reflection of predetermined wavelength components of wave-guiding light. Therefore, induced emission of a plurality of wavelengths different in wavelength, which is one of the objects of the present invention, can be performed without any problem even in the case of the layout of the electrodes shown in FIGS. 20(b) and 20(c).

Figure 21:
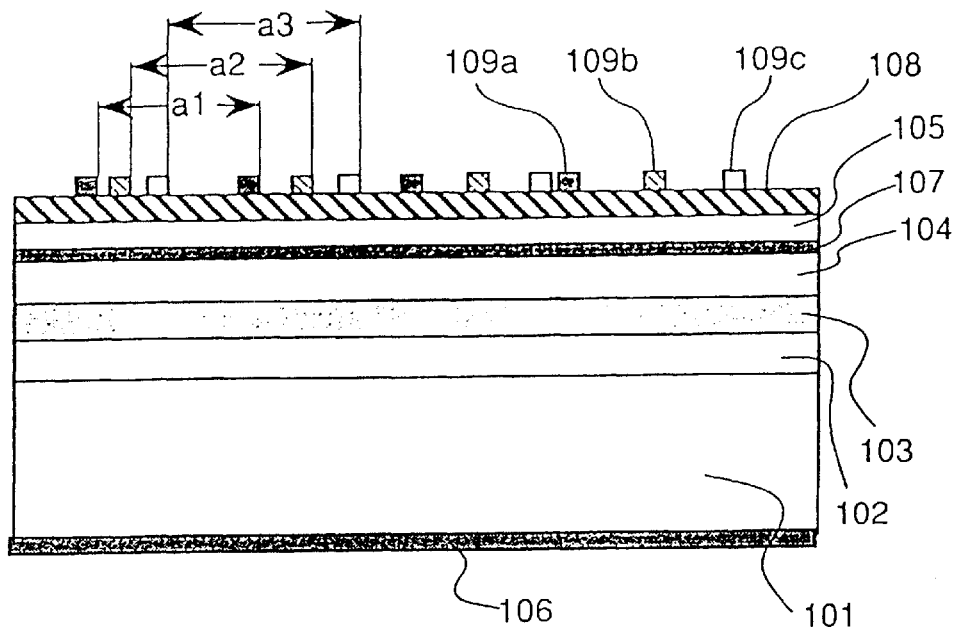
FIG. 21 is a diagram depicting one example of a semiconductor device suitable for a light signal transmission unit of an optical communication system of the present invention.

A structure of a multiple wavelength laser constructed as a distributed feedback type InGaAsP laser, which is provided with one-dimensional surface grating electrodes of two types or more for forming diffraction gratings based on periodic changes in refractive index of a medium (which has two or more cycles for electrodes), and an example of manufacturing the multiple wavelength laser will further be explained with reference to FIG. 21. First of all, a p type InP cladding layer 102 and an InGaAsP active layer 103 are grown over a p type InP substrate 101 by a liquid phase epitaxy method (LPE method) or an organometal chemical vapor deposition method (MOCVD method). Next, the InGaAsP active layer is etched in stripe form in a manner similar to the semiconductor device shown in FIG. 15, after which an n type InP cladding layer 104 is grown thereon and a metal film for a current injecting electrode is grown over the n type InP cladding layer 104. The metal film for the current injection is formed of a material (such as AuGe/Ni/Au, AuSn/Mo/Au or the like) ohmic-junctioned with the n type cladding layer. Next, the metal film for the current injecting electrode is etched in stripe form in a manner similar to the process of the semiconductor device shown in FIG. 15, after which an InP optical guide layer 105 doped with no impurity is grown. Next, an insulating film 108 (such as $SiO_2$, PLZT or the like) is formed over the surface of the InP optical guide layer, and electrode metal films for field application are grown over the upper surface thereof. Thereafter, such one-dimensional surface gratings as to be provided at predetermined intervals a1 (e.g., 240 nm) in a one-dimensional direction are formed over photoresists applied onto the surfaces of the electrodes by a two beam interferometric exposure method. A surface grating of a cycle a2 different from the cycle a1 of the surface grating is formed in parallel to the surface grating. Further, surface gratings of a3 to an different in cycle from each other are formed in a manner similar to the surface grating of a2 (however, the surface gratings up to a3 are used in the example shown in FIG. 21). Patterns for the one-dimensional surface gratings may be drawn onto their corresponding photoresists by electron beam exposure as an alternative to the exposure process. After the patterns have been formed over the photoresists, field applying electrodes are etched with the resists as masks. FIG. 21 shows a surface grating 109a of a1, a surface grating 109b of a2, and a surface grating 109c of a3. An electrode film 106 for current injection is provided over the back of the p type InP substrate. A material for the electrode film 106 for the current injection is a material ohmic-junctioned with the p type InP substrate 101, which is, for example, Cr/Au, Ti/Pt/Au, AuZn/Ti/Pt/Au or the like.

Figure 22:
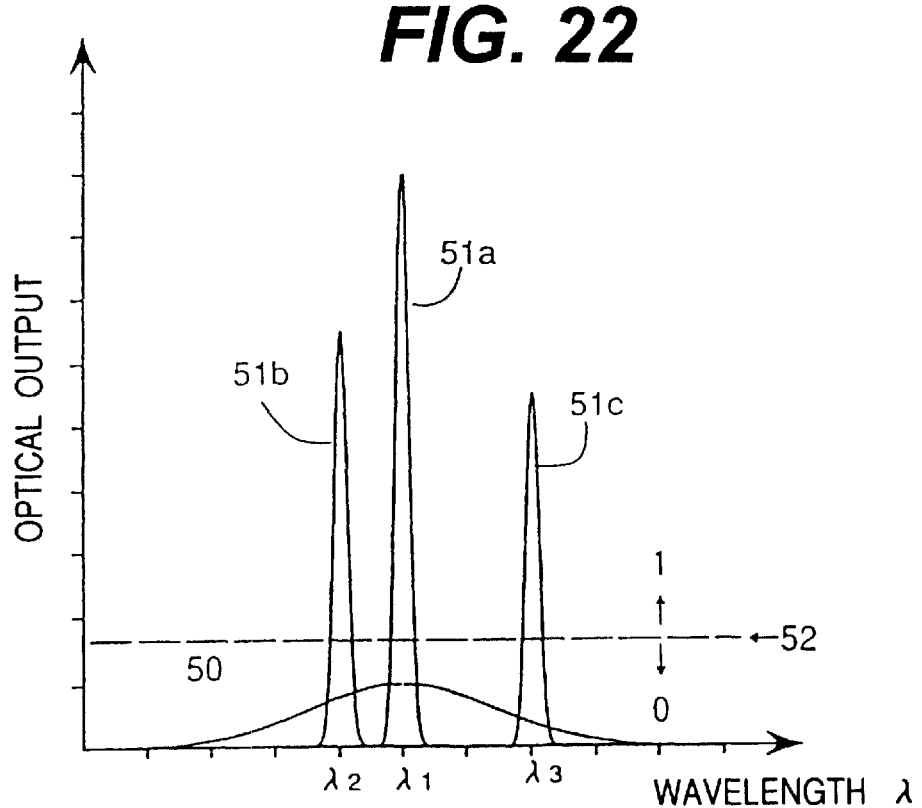
FIG. 22 is a diagram showing spectrums of light emitted from a light signal transmission unit of an optical communication apparatus according to the present invention.
Figure 23A:
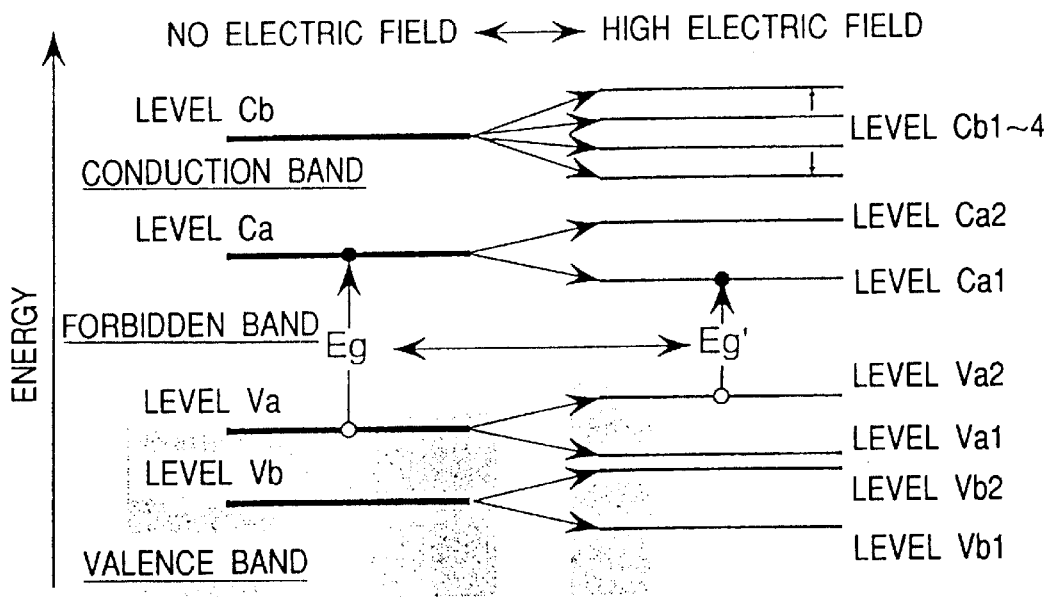
FIG. 23 is a diagram for describing a Stark effect produced by the application of an electric field to a semiconductor crystal and changes in optical absorption coefficient.
Figure 23B:
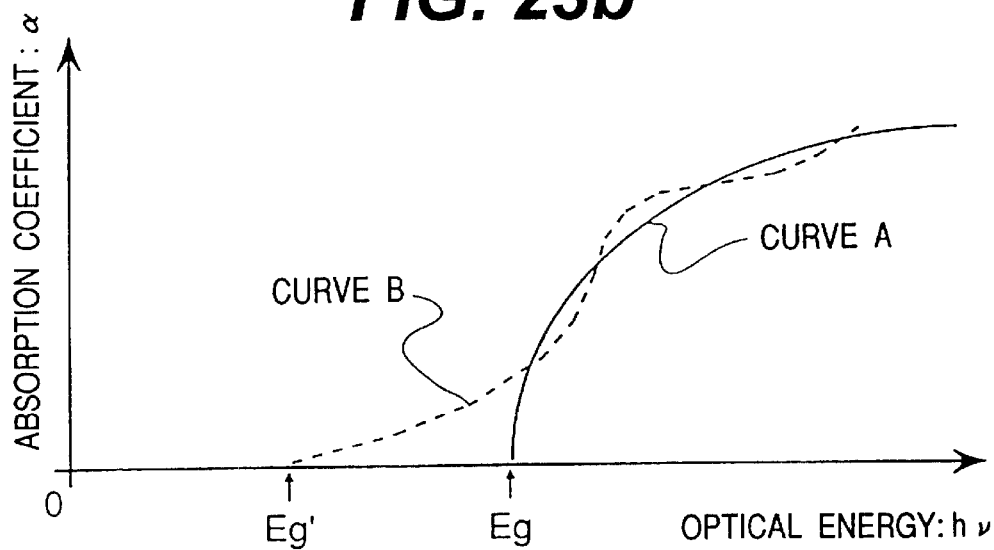
Figure 24:
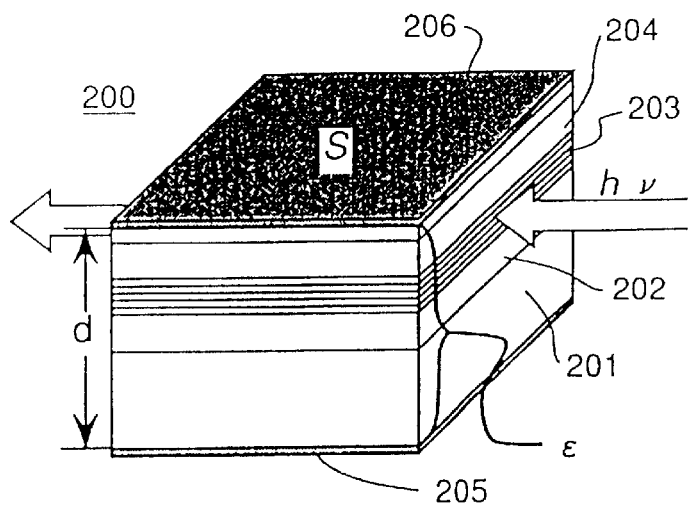
FIG. 24 is a diagram for describing the concept of an optical modulator of the Background Art.
Figure 25:
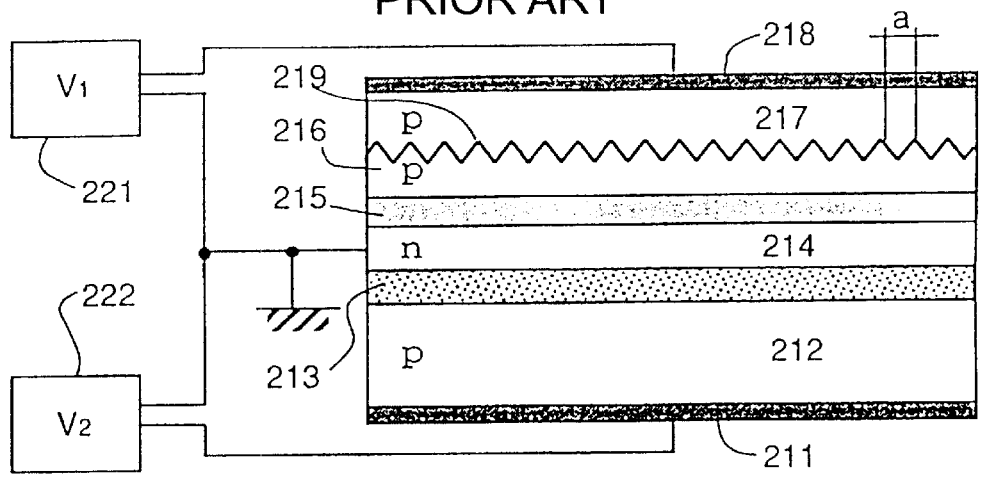
FIG. 25 is a diagram showing one example of a semiconductor laser of the Background Art.
Figure 26:
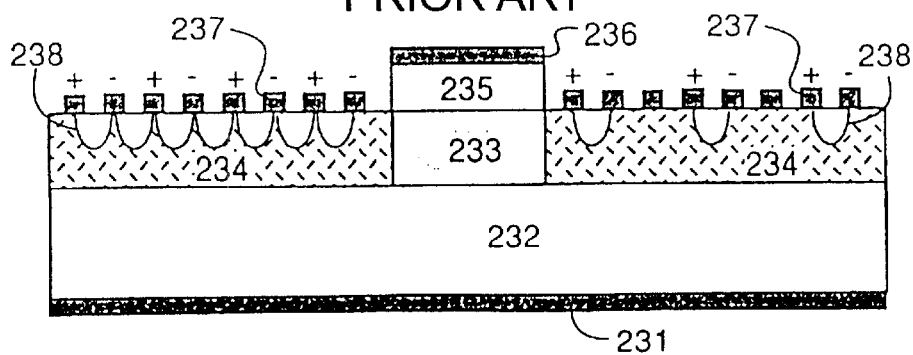
FIG. 26 is a diagram illustrating one example of a semiconductor laser of the Background Art.

If a positive voltage is applied to the back electrode 106 and a negative voltage is applied to the electrode 107 to thereby inject a current into the active layer 103, then a light emission phenomenon (spontaneous emission) in a light-emission diode mode occurs within the active layer 103 as shown in a wavelength profile 50 of FIG. 22. If a voltage is applied to each field applying surface grating electrode 109, then laser light having a wavelength of $2 \times a1 \times n_{eff}$ is radiated. Incidentally, a wavelength profile 51a, a wavelength profile 51b and a wavelength profile 51c are respectively obtained by the electrode layer 109a, electrode layer 109b and electrode layer 109c in a spectrum shown in FIG. 22. Here, $n_{eff}$ indicates the refractive index of the InGaAs active layer 103. If input electric signals $S_1$, $S_2$ and $S_3$ are respectively distributed to voltage pulses applied to surface grating electrodes 109a, 109b and 109c by a coding device 124 to control laser oscillations when the present semiconductor device is used in the optical communication system shown in FIG. 18, then a high-speed and high-capacity electricity-light signal conversion can be performed, thus making it possible to perform multiplex transmission free of any delay time.

What is claimed is:
1. An optical communication apparatus, comprising
    light signal generating means for generating light signals according to induced emission; and
    light intensity attenuating means optically coupled to said light signal generating means, and
    wherein said light intensity attenuating means is optically coupled to a light signal transmission line,
    said light signal generating means has a light emitting portion for generating light according to the injection of a current therein, an induced emission unit for inductively emitting each light signal, and an excitation light generating unit for producing the induced emission, and
    said excitation light generating unit supplies light of a specific wavelength component, which is included in the light produced in said light emitting portion according to an electric field signal corresponding to transmission information, to said induced emission unit.
2. The optical communication apparatus according to claim 1, wherein the electric field signal applied to said excitation light generating unit is inputted as each voltage pulse, and the width of said voltage pulse is $1 \times 10^{-9}$ seconds or less.
3. The optical communication apparatus according to claim 1, wherein the voltage amplitude of the electric field signal applied to said excitation light generating unit is smaller than a potential difference applied to said light emitting portion.
4. The optical communication apparatus according to claim 1, wherein light signal amplifying means is provided between said light intensity attenuating means and said light signal transmission line.
5. An optical communication apparatus, comprising:
    means for generating light signals according to induced emission; and
    wavelength selecting means optically coupled to said light signal generating means; and
    wherein said wavelength selecting means is optically coupled to a light signal transmission line,
    said light signal generating means has a light emitting portion for generating light according to the injection of a current therein, an induced emission unit for inductively emitting each light signal, and an excitation light generating unit for producing the induced emission, and said excitation light generating unit supplies light of a specific wavelength component, which is included in the light produced in said light emitting portion according to the application of an electric field signal corresponding to transmission information, to said induced emission unit.

6. The optical communication apparatus according to claim 5, wherein the electric field signal applied to said excitation light generating unit is inputted as each voltage pulse, and the width of said voltage pulse is $1\times10^{-9}$ seconds or less.

7. The optical communication apparatus according to claim 5, wherein the voltage amplitude of the electric field signal applied to said excitation light generating unit is smaller than a potential difference applied to said light emitting portion.

8. The optical communication apparatus according to claim 5, wherein light signal amplifying means is provided between said wavelength selecting means and said light signal transmission line.

9. An optical communication system, comprising:

a signal transmitting unit for modulating the intensity of light lying in a predetermined wavelength band by an electric signal to thereby generate a light signal and transmitting the light signal therefrom;

a light signal transmission line for transmitting the light signal; and a signal receiving unit for receiving a light signal transmitted through said light signal transmission line; and wherein said signal transmitting unit inductively emits the light signal, based on excitation light produced according to the electric signal and transmits the light signal from said signal transmitting unit to said signal receiving unit at a transmission rate of 1 Gb/s or more.

10. The optical communication system according to claim 9, wherein the transmission rate of the light signal is 10 Gb/s or more.

11. The optical communication system according to claim 9, wherein said excitation light is generated as a light pulse corresponding to transmission information, and the width of the light pulse is $1\times10^{-9}$ seconds or less.

12. The optical communication system according to claim 9, wherein said signal receiving unit distributes the light signal to a plurality of transmission lines and receives the distributed light signals every said transmission lines, and said respective transmission lines are respectively provided with light switches for intermittently cutting off the light signals.

* * * * *